(12) United States Patent
Morikado

(10) Patent No.: US 8,492,825 B2
(45) Date of Patent: Jul. 23, 2013

(54) NONVOLATILE SEMICONDUCTOR MEMORY DEVICE AND METHOD OF FABRICATING THE SAME

(75) Inventor: Mutsuo Morikado, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 13/050,655

(22) Filed: Mar. 17, 2011

(65) Prior Publication Data

US 2011/0241094 A1 Oct. 6, 2011

(30) Foreign Application Priority Data

Mar. 30, 2010 (JP) ................. 2010-079827

(51) Int. Cl.
*H01L 21/8247* (2006.01)
(52) U.S. Cl.
USPC ...................... 257/316; 257/E29.3
(58) Field of Classification Search
USPC .............................. 257/316, E29.3
See application file for complete search history.

(56) References Cited

U.S. PATENT DOCUMENTS

| 6,063,688 | A | 5/2000 | Doyle et al. | |
|---|---|---|---|---|
| 6,515,329 | B2 | 2/2003 | Lee et al. | |
| 7,528,452 | B2 | 5/2009 | Sugimae et al. | |
| 7,615,819 | B2 | 11/2009 | Nishimura | |
| 8,193,058 | B2 | 6/2012 | Ide et al. | |
| 2007/0196983 | A1* | 8/2007 | Hong | 438/257 |
| 2007/0257305 | A1* | 11/2007 | Sasago et al. | 257/316 |
| 2009/0014771 | A1 | 1/2009 | Ide et al. | |
| 2011/0241095 | A1* | 10/2011 | Sugimae et al. | 257/316 |

FOREIGN PATENT DOCUMENTS

| JP | 2001-223284 | 8/2001 |
|---|---|---|
| JP | 2006-108510 | 4/2006 |
| JP | 2007-227900 | 9/2007 |
| JP | 2008-10738 | 1/2008 |
| JP | 2009-10011 | 1/2009 |
| JP | 2011-21112 | 2/2011 |

OTHER PUBLICATIONS

Japanese Office Action issued Aug. 24, 2012, in Japan Patent Application No. 2010-079827 (with English Translation).

* cited by examiner

*Primary Examiner* — George Fourson, III
(74) *Attorney, Agent, or Firm* — Oblon, Spivak, McClelland, Maier & Neustadt, L.L.P.

(57) ABSTRACT

According to one embodiment, a semiconductor memory device includes each of memory cells including a floating electrode above a semiconductor substrate via the gate insulator, a control gate electrode above the floating gate electrode via a first inter-gate insulator, first diffusion layers as source or drain, a contact electrode portion including a bottom electrode with an opening and a top electrode on the bottom electrode, the bottom electrode being arranged on the first gate insulator having the opening, the top electrode being electrically connected to the semiconductor substrate via the first opening, and a connection diffusion layer formed in the semiconductor substrate below the first opening.

11 Claims, 23 Drawing Sheets

NONVOLATILE SEMICONDUCTOR MEMORY DEVICE AND METHOD OF FABRICATING THE SAME

CROSS REFERENCE TO RELATED APPLICATION

This application is based upon and claims the benefit of priority from prior Japanese Patent Application No. 2010-079827, filed on Mar. 30, 2010, the entire contents of which are incorporated herein by reference.

FIELD

Exemplary embodiments described herein generally relate to a nonvolatile semiconductor memory device and a method of fabricating the nonvolatile semiconductor memory device and more particularly, to a contact structure in the nonvolatile semiconductor memory device.

BACKGROUND

A nonvolatile semiconductor memory device, for example, a NAND flash memory has been installed in various kinds of electron devices.

As memory capacitors in the NAND flash memory device has been increased, shrinking of memory cells has been preceded.

Here, both contact resistance and aspect ratio in a contact structure of the NAND flash memory have significantly become tight.

Therefore, improvement approaches on the contact structure are proposed in conventional technology.

DETAILED DESCRIPTION

Figure 1:
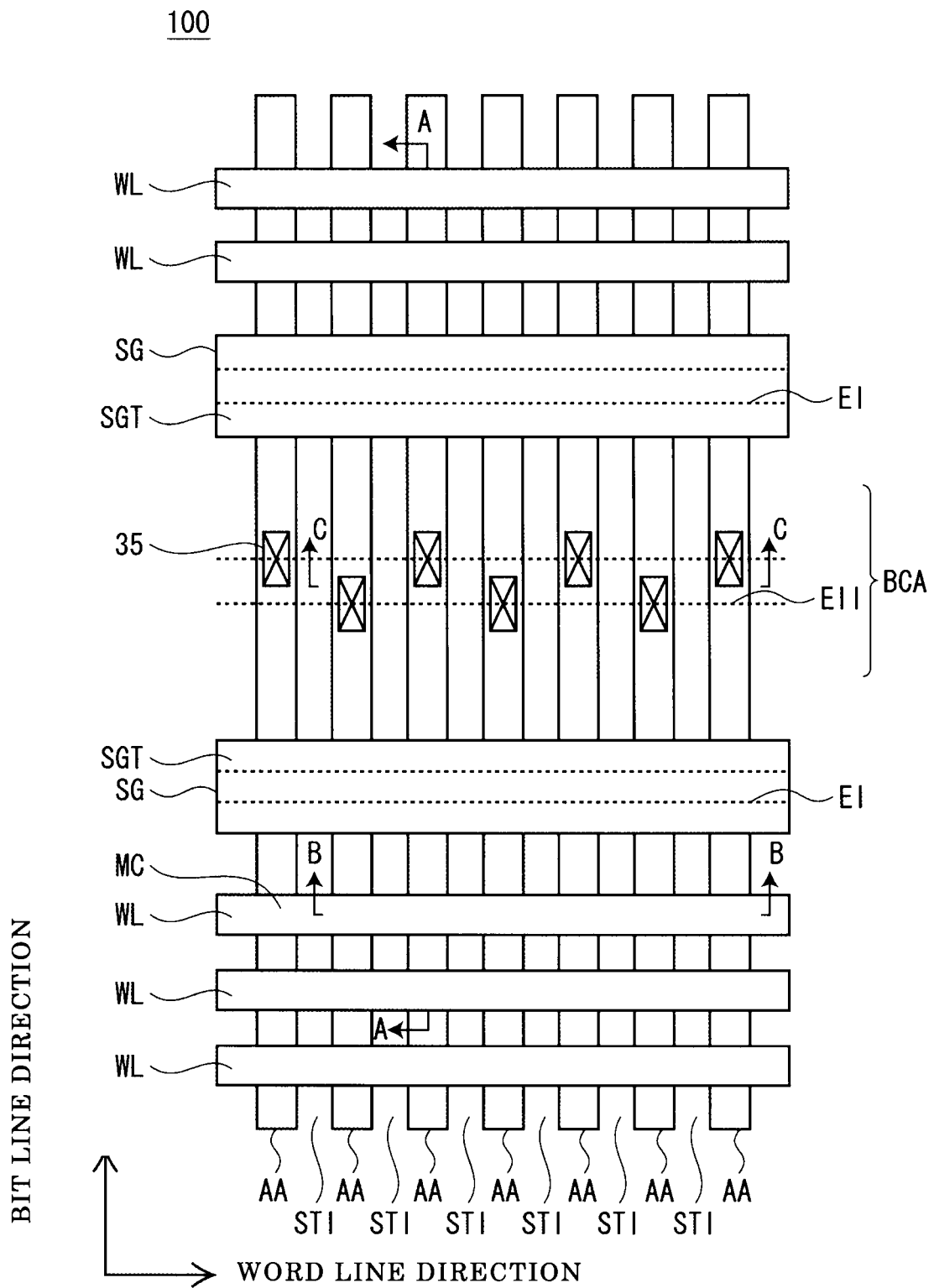
FIG. 1 is a plane view showing a structure of memory array in a semiconductor memory device according to a first embodiment.

An aspect of the present embodiment, there is provided a semiconductor memory device including a semiconductor substrate, a gate insulator disposed on the semiconductor substrate, a plurality of memory cells, each of the memory cells being arranged along a first direction and including a floating electrode above the semiconductor substrate via the gate insulator, a control gate electrode above the floating gate electrode via a first inter-gate insulator, first diffusion layers formed in the semiconductor substrate to sandwich a portion immediately beneath the floating gate electrode, each of the first diffusion layers having a reverse impurity type to the semiconductor substrate, a contact electrode portion including a bottom electrode with a first opening and a top electrode on the bottom electrode, the bottom electrode being arranged on the first gate insulator having the first opening, the top electrode being electrically connected to the semiconductor substrate via the first opening, and a connection diffusion layer formed in the semiconductor substrate below the first opening and the connection diffusion layer having the reverse impurity type to the semiconductor substrate.

Embodiments will be described below in detail with reference to the attached drawings mentioned above.

It should be noted that the embodiments covers their equivalents.

Throughout the attached drawings, similar or same reference numerals show similar, equivalent or same components.

First Embodiment

[Plane Structure]

A plane structure of a memory cell array in a semiconductor memory device according to a first embodiment, for example, is described by using FIG. 1.

A NAND flash memory is explained as an example for the semiconductor memory device in this embodiment.

As shown in FIG. 1, a memory cell array 100 including a plurality of active areas AA and a plurality of isolation insulators STI are extended along a bit line (BL) direction which is intersected with the WL direction. Each of the active areas is arranged with a designated interval. Each of the isolation insulators STI is arranged between the adjacent active areas AA. Further, the memory cell array 100 includes word lines WL extended along the word line direction, and each of the word lines WL is arranged with a designated interval towards the BL line direction. Each of the memory cells MC is formed at each intersection of the active area AA and the word line WL. A memory string is the memory cells MC in series to the bit line direction.

A plurality of selection gates SG extended to the word line direction are formed at both edges of the memory cell string. A plurality of selection gate transistors SGT are respectively formed at intersections in each of the selection gates SG and the active area AA. Further, the selection gates SG are adjoined in the bit line direction, a bit line contact area BCA is arranged between the selection gates SG. A contact plug 35 is arranged in the active area AA of the bit line contact area BCA.

An opening EI extended to the word line is arranged at nearly a central portion of the selection gate SG. Further, an opening EII extended to the word line direction is arranged at nearly a central portion of the bit line contact area BCA. In addition, the position of the opening EII is not restricted at the central portion and may be set at any position in the bit line contact area BCA. The opening EI and the opening EII are described in an example of a cross-sectional structure.

[Cross-Sectional Structure]

Figure 2A:
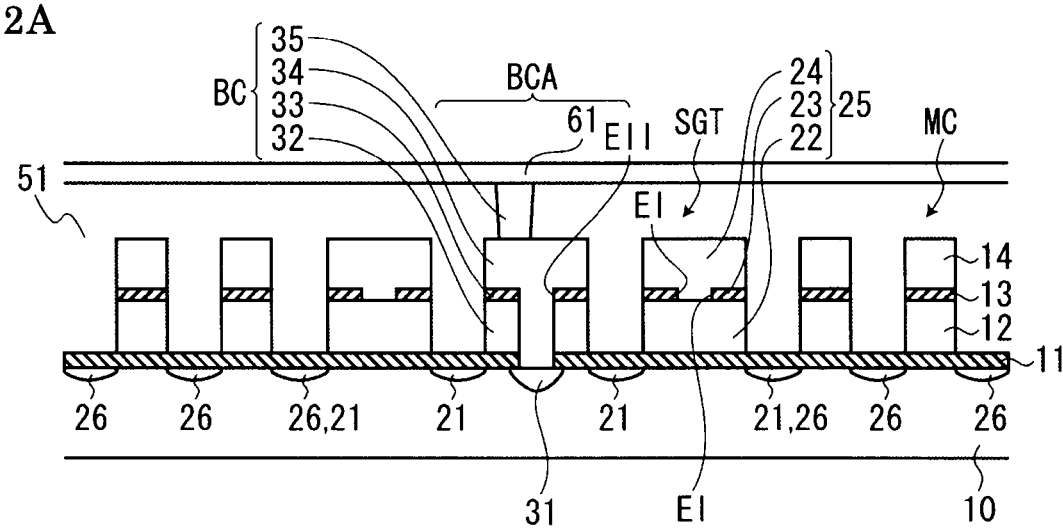
FIGS. 2A, 2B, 2C are cross-sectional views taken along an A-A line, a B-B line and a C-C line in FIG. 1, respectively, showing a NAND flash memory according to the first embodiment.
Figure 2B:
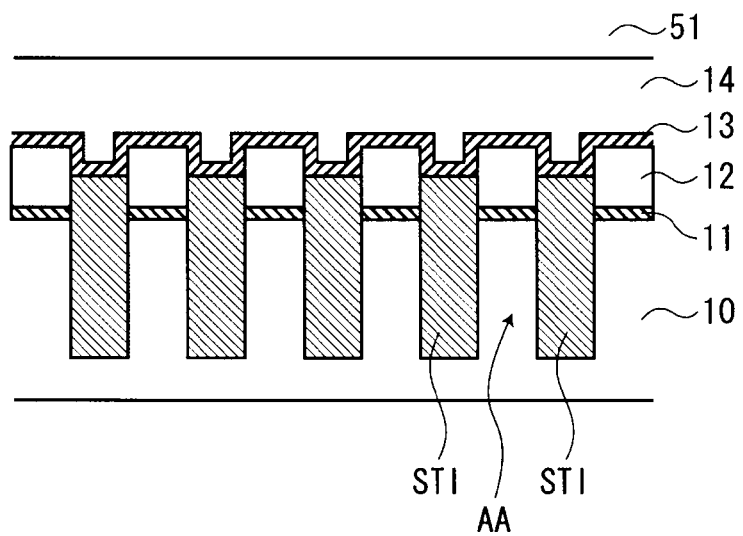
Figure 2C:
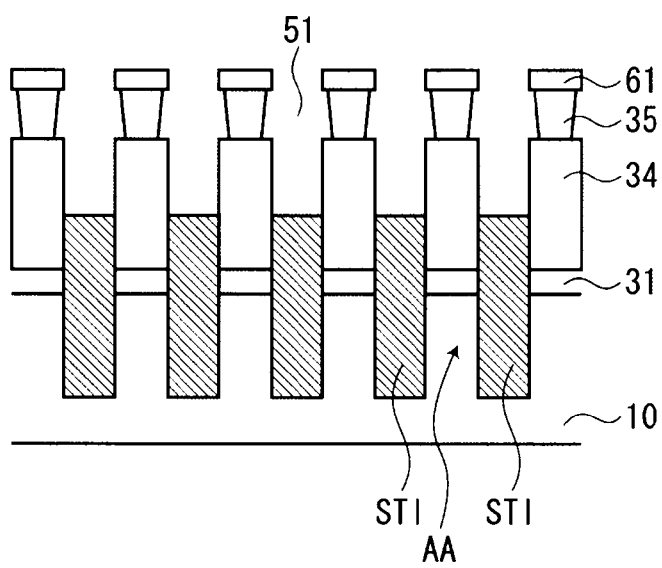

Across-sectional structure of the memory cell array in the semiconductor memory device according to the first embodiment, for example, is described by using FIGS. 2A-2C. FIGS. 2A-2C are cross sectional views showing the memory cell array taken along A-A line, B-B line and C-C line in FIG. 1, respectively, according to the first embodiment.

As shown in FIG. 2A, each of the memory cells MC includes a floating gate electrode 12 disposed on a semiconductor substrate 10 via a gate insulator 11, a control gate electrode 14 disposed on the floating gate electrode 12 via a first inter-gate insulator 13. Diffusion layers 26 as a source-drain diffusion layer is formed on a surface of the semiconductor substrate 10 between the adjacent memory cells MC. Here, a memory transistor MT is constituted with the memory cell MC, the gate insulator 11 and the diffusion layers 26.

The selection gate transistor SGT includes a gate electrode 25 disposed on the semiconductor substrate 10 via the gate insulator 11 and diffusion layers 21 as a source-drain layer formed to sandwich a portion below the gate electrode 25. The gate electrode 25 includes a lower layer gate electrode 22 and an upper layer gate electrode 24. The lower layer gate electrode 22 is formed of the same material as the floating gate electrode 12. The upper layer gate electrode 24 is disposed on the lower layer gate electrode 22 via a second inter-gate insulator 23 with the opening EI. The lower layer gate electrode 22 is electrically connected to the upper layer gate electrode 24 via the opening EI.

Each of the diffusion layers 26 of the memory cell transistor MT is commonly connected to form a memory cell unit, the diffusion layer 26 at an end portion of the memory cell transistor MT of the memory cell unit and the diffusion layer 21 of the selection gate transistor is commonly connected to form a NAND string.

A bit line contact BC is disposed in the bit line contact area BCA. The bit line contact BC includes a bottom electrode 32 dispose on an upper surface of the semiconductor substrate 10 via the gate insulator 11, an inter-gate insulator 33 dispose on the bottom electrode 32, a top electrode 34 and the contact plug 35 connected to an upper surface of the top electrode 34. The top electrode 34 penetrates through the bottom electrode 32 and the inter-gate insulator 33 to contact to the surface of the semiconductor substrate 10 via the opening EII which exposes the surface of the semiconductor substrate 10. Further, the top electrode 34 is formed of the same material as the control gate electrode 12. A side surface of the bottom electrode 32 exposed by the opening EII and a side surface of the top electrode formed in the opening EII are contacted to electrically connect each other. The bottom electrode 32 is formed of the same material as the floating electrode 12. In addition, a position of an upper surface of the top electrode 34 is nearly the same as positions of an upper surface of the bottom electrode 32 and an upper surface of the floating electrode 12.

Further, the gate insulator 11 is dispose between the contact electrode 32 and the semiconductor substrate 10 at an end portion of the contact electrode 32 in the bit line contact BC. It is possible to enlarge an alignment margin of the bottom electrode 32 at the opening EII mentioned after in other to be formed the gate insulator 11 at the end portion of the contact electrode 32.

In addition, a connection diffusion layer 31 is formed on a surface of the semiconductor substrate 10 positioned immediately beneath the opening EII. The connection diffusion layer 31 may be connected to the diffusion layer 21. However, it is no problem that the two diffusion layers are set to be in a distance which electrical potential can be transferred from the contact electrode BC to the diffusion layer 21, when the connection diffusion layer 31 is separated to the diffusion layer 21. In a case of applying 2.5V to the bit line contact BC, for example, an inversion layer is formed immediately beneath the gate insulator 11 formed between the bottom electrode 32 and the semiconductor substrate 10, so that the connection diffusion layer 31 is connected to the diffusion layer 21. In the figures including mentioned after, a case which the diffusion layer 31 is separated to the diffusion layer 21, for example, is described for easily watching the structure.

An inter-layer insulator 51 is disposed to cover a portion between the memory cells MC. An upper layer wiring 61 is disposed on the insulator 51 to connect to the contact electrode BC via the contact plug 35.

As shown in FIG. 2B, the isolation insulators STI are disposed in the surface area of the semiconductor substrate 10. The semiconductor substrate 10 sandwiched by each of the isolation insulators STI is each of the active areas AA.

The floating gate electrode 12 is disposed on the semiconductor substrate 10 via the gate insulator 11. A lower portion side surface of the floating gate electrode 12 is contacted to the isolation insulator STI. Further, an upper portion of the floating gate electrode 12 is protruded from an upper surface of the isolation insulator STI. The inter-gate insulator 13 is continuously disposed on the upper surface of the isolation insulator STI and both upper surface and side surface of the floating gate electrode 12. The control gate electrode 14 is disposed on the inter-gate insulator 13.

As shown in FIG. 2C, the isolation insulator STI is disposed in the surface area of the semiconductor 10 as a cross-sectional shape in the bit line contact area BCA. The semiconductor 10 interposed by the isolation insulators STI is the active area AA. The connection diffusion layer is formed in a surface area of the semiconductor 10.

The top electrode 34 is disposed to contact with the surface of the connection diffusion layer 31 in the semiconductor substrate 10. A portion of a side surface of the top electrode 34 is contacted to the isolation insulator STI. Further, an upper surface of the top electrode 34 is higher than the upper surface of the isolation insulator STI, the top electrode 34 disposed on each active area AA are separated by the isolation insulator STI. The upper layer wiring 61 is formed to contact to an upper surface of the contact plug 35. In addition, the contact plug 35 and the upper layer wiring 61 are covered with the inter-layer insulator 51.

[Fabricating Method]

Next, a method of fabricating the semiconductor memory device in this embodiment is explained by using FIGS. 3-7. FIGS. 3A-7A are cross-sectional views taken along an A-A line in FIG. 1. FIGS. 3B-7B are cross-sectional views taken along a B-B line in FIG. 1.

N-type impurities (not illustrated) are introduced into the semiconductor substrate 10, for example, using ion implantation or the like to form an n-well area. P-type impurities, boron or the like, are introduced into the n-well area in the semiconductor substrate 10, for example, using ion implantation or the like to form a p-well area.

Figure 3A:
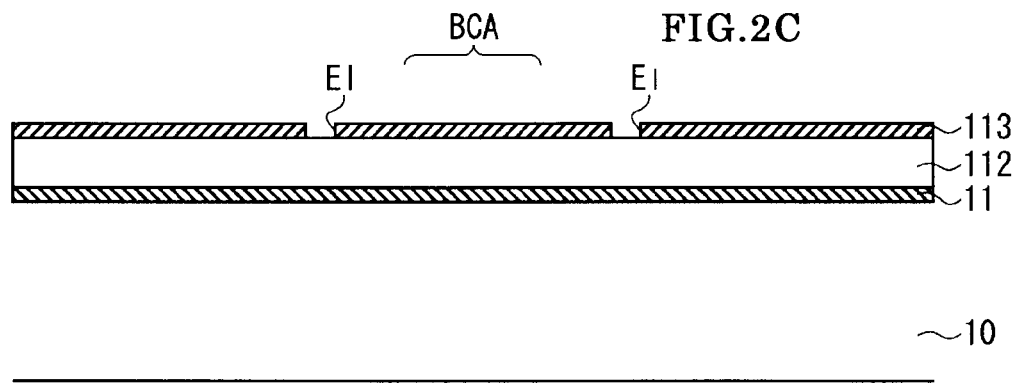
FIGS. 3A, 3B, 3C are cross-sectional views taken along the A-A line, the B-B line and the C-C line in FIG. 1, respectively, showing a fabricating process of the NAND flash memory according to the first embodiment.
Figure 3B:
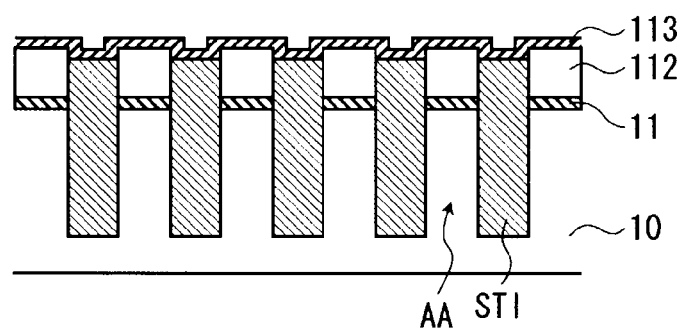
Figure 3C:
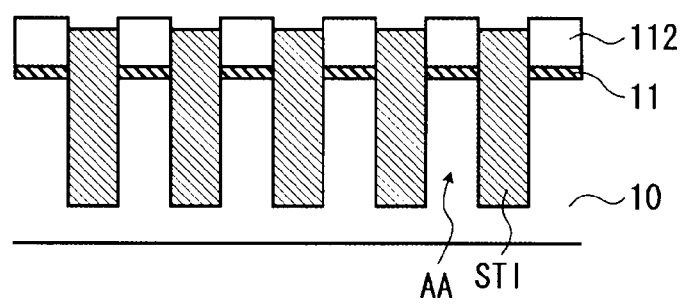

As shown in FIGS. 3A-3C, the gate insulator 11, for example, a silicon oxide film is formed on the surface of the semiconductor substrate 10 by thermal oxidation. A first poly-crystalline silicon film 112, for example, is formed on the gate insulator 11. The first poly-crystalline silicon film 112, the silicon oxide film and the semiconductor substrate 10 are selectively etched to form a trench groove. An insulator is embedded in the groove to form the isolation insulator STI.

After an upper surface of the isolation insulator STI is lowered below the upper surface of the first poly-crystalline silicon film 112, an insulator composed of an ONO film, for example, is deposited on the first poly-crystalline silicon film 112 and the isolation insulator. A portion of the insulator 113 in an area, in which the selection gate transistor SGT is formed, is leaved to form an opening EI to expose the first poly-crystalline silicon film 112. Forming the opening EI is called as the EI process.

Figure 4A:
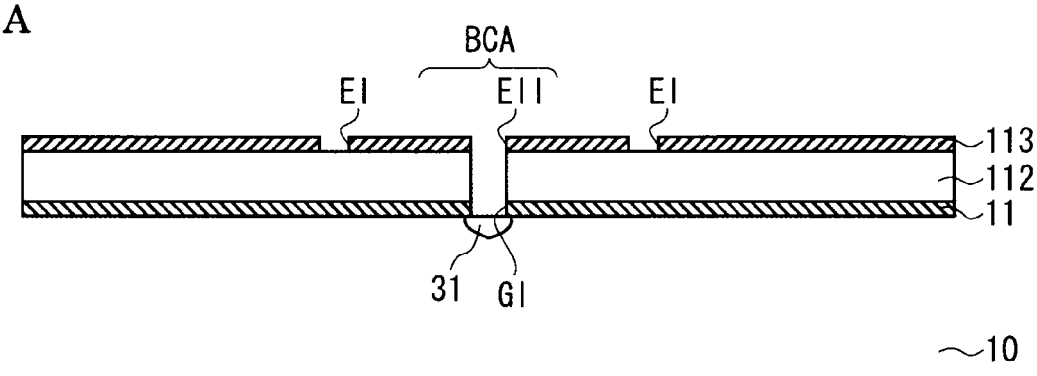
FIG. 4 is a cross-sectional view showing the fabricating process of the NAND flash memory successively from FIG. 3 according to the first embodiment.
Figure 4B:
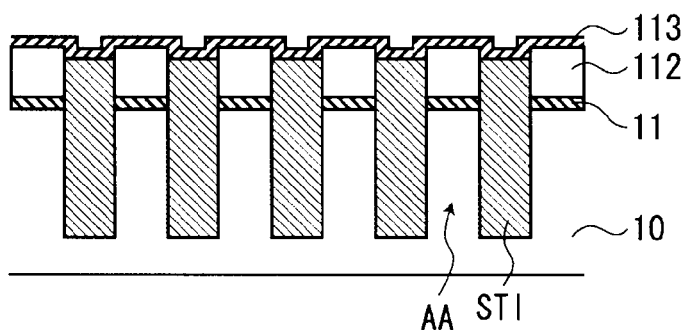
Figure 4C:
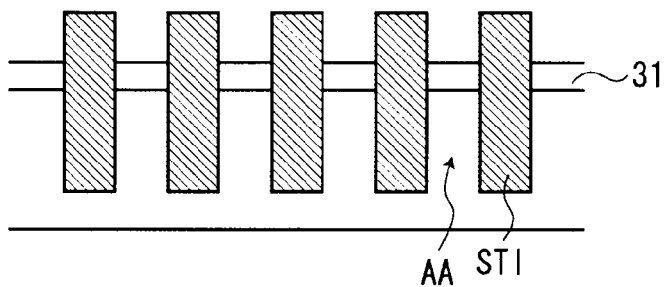

As shown in FIG. 4A-4C, the insulator 113, the first poly-crystalline silicon film 112 and a portion of the gate insulator 11 in the bit line contact area BCA is removed by lithography and etching, so that the opening EII is formed to expose the semiconductor substrate.

Forming the opening EII is called an EII process.

Here, the opening EII is formed nearly at the center of the opening EII in the bit line contact area BCA. The gate insulator 11 is formed between the bottom electrode 32 and the semiconductor substrate 10 at the end portion of the contact electrode BC. As a result, it is possible to prevent misalignment between bottom electrode 32 and the opening EII.

The opening EII can be formed by following modification mentioned below. In the EII process, a portion of the insulator 113, at which the opening EII is formed, is simultaneously leaved. A portion other than the bit line contact area BCA is covered with, for example, a resist and the first poly-crystalline silicon film 112 and the gate insulator 11 is removed using the insulator 113 and the resist as a mask so as to expose the semiconductor substrate 10 in the EII process. In such the modification, the mask of the opening EII can be formed by using lithography of the EII process used by high accuracy process and alignment. As a result, an opening width and a position of the opening EII can be accurately determined.

After forming the opening EII, the connection diffusion layers 31 are formed by ion-implantation using the insulator 113 and the first poly-crystalline 112 as a mask. As a result, the connection diffusion layers 31 can be formed immediately beneath the opening EII.

Figure 5A:
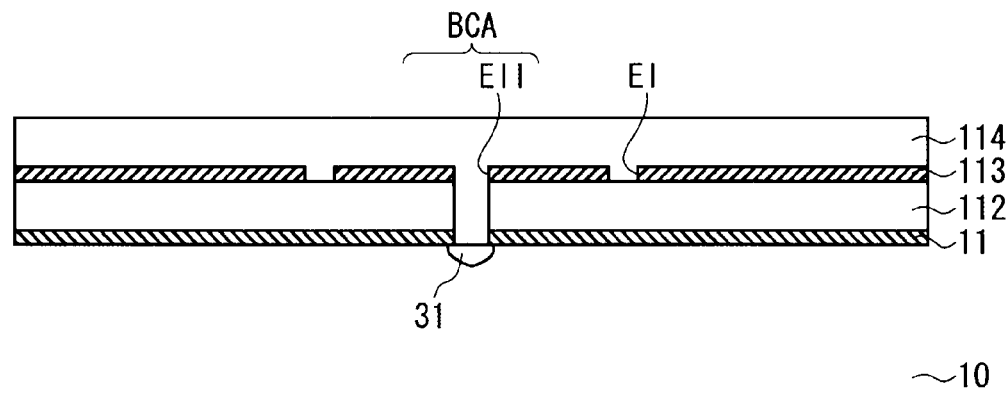
FIG. 5 is a cross-sectional view showing the fabricating process of the NAND flash memory successively from FIG. 4 according to the first embodiment.
Figure 5B:
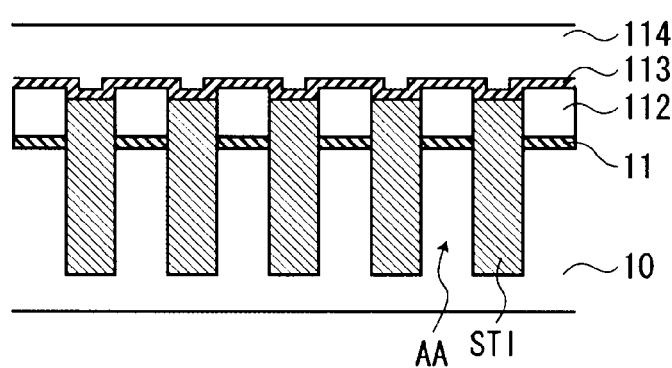
Figure 5C:
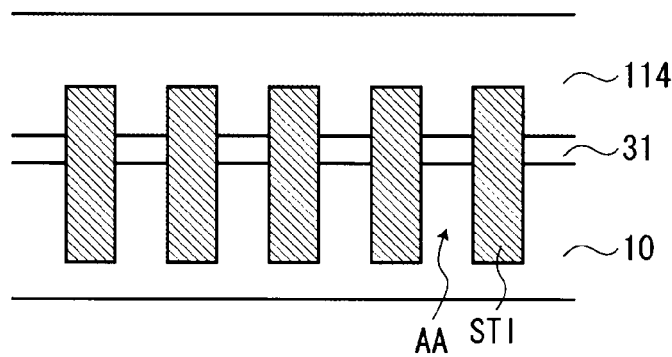

As shown in FIG. 5A-5C, a second poly-crystalline silicon film 114 are deposited in the opening EI, on the first poly-crystalline silicon film 112 exposed from the opening EI and in the opening EII. As a result, the first poly-crystalline silicon film 112 and the second poly-crystalline silicon film 114 are connected via the opening EI and the connection diffusion layer 31 in the semiconductor substrate 10, the first poly-crystalline silicon film 112 and the second poly-crystalline silicon film 114 are connected via the opening EII.

Figure 6A:
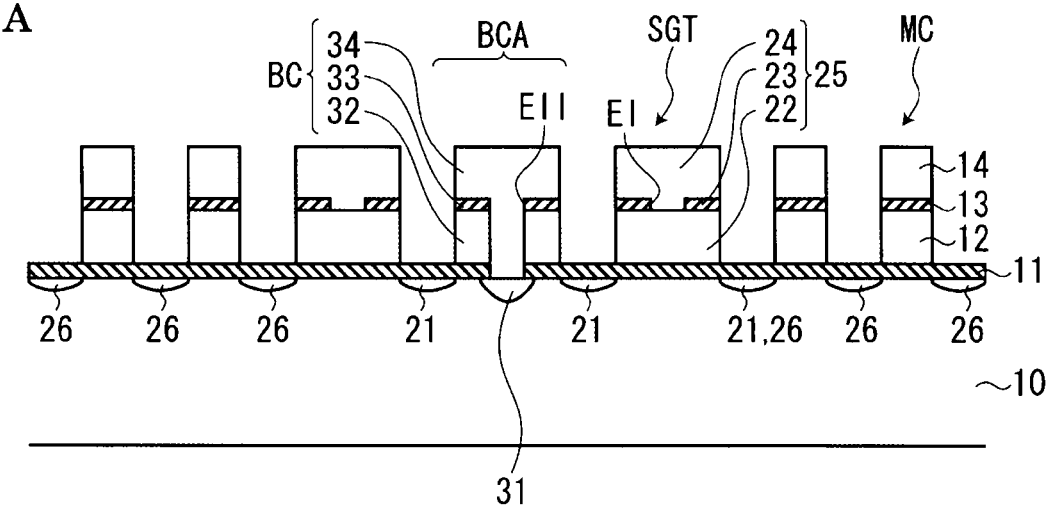
FIG. 6 is a cross-sectional view showing the fabricating process of the NAND flash memory successively from FIG. 5 according to the first embodiment.
Figure 6B:
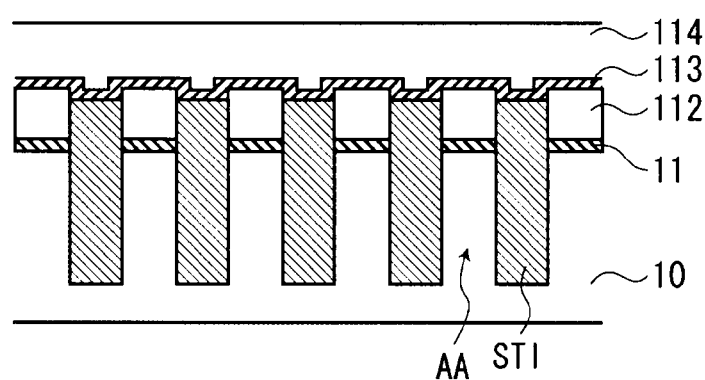
Figure 6C:
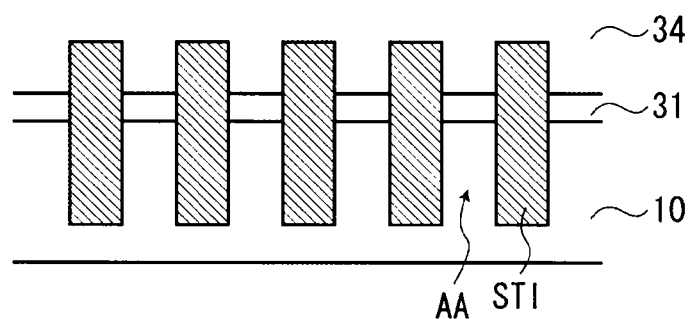

As shown in FIG. 6A-6C, a mask material formed of a silicon nitride film, for example, is formed on the second poly-crystalline 114. Further, a mask pattern extended to the word line direction is formed in the bit line contact area BCA as well as forming patterns of the word line WL and the selection gate.

The first poly-crystalline silicon film 112, the insulator 113, the second poly-crystalline silicon film 114 and the mask material are removed by etching using the mask pattern. The gate electrode 25 of the memory cell MC and the selection gate transistor SGT, and the contact electrode BC are formed.

Here, the first poly-crystalline silicon film 112 in the memory cell MC is the floating gate electrode 12, the insulator 113 is the inter-gate insulator 13, and the second poly-crystalline silicon film 114 is the control gate electrode 14. Further, the first poly-crystalline silicon film 112 in the selection gate transistor SGT is the lower layer gate electrode 22, the insulator 113 is the inter-gate insulator 23, and the second poly-crystalline silicon film 114 is the upper gate electrode 24. Further, the first poly-crystalline silicon film 112 in the contact electrode BC is the bottom electrode 32, the insulator 113 is the inter-gate insulator 33, and the second poly-crystalline silicon film 114 is the top electrode 114.

Arsenic or phosphorous, for example, as an impurity is implanted into the semiconductor substrate 10 by ion-implantation using the gate electrodes 25 of both the memory cell MC and the selection gate transistor SGT, and the contact electrode BC of the top electrode 34 as a mask. As a result, the source-drain diffusion layers 21, 26 are formed to sandwich a portion between the adjacent memory cells MC and the gate electrode 25.

Figure 7A:
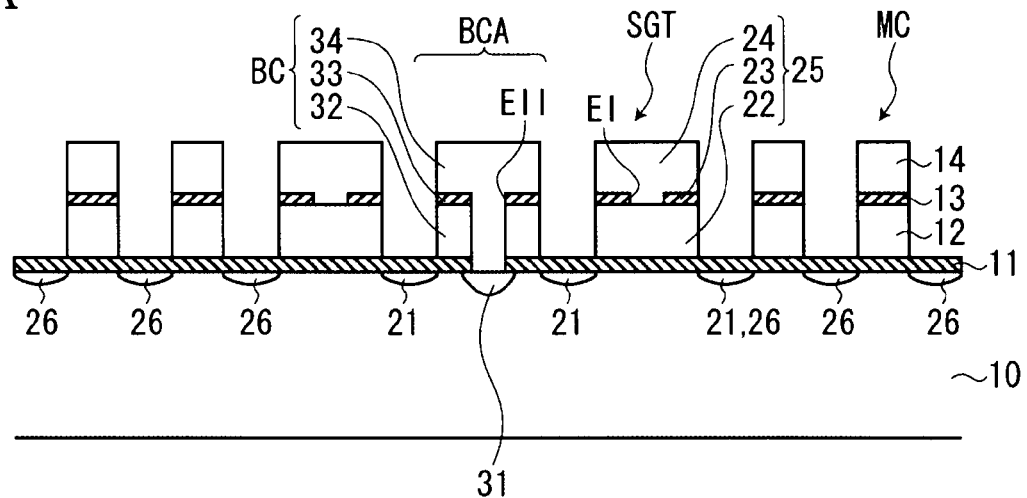
FIG. 7 is a cross-sectional view showing the fabricating process of the NAND flash memory successively from FIG. 6 according to the first embodiment.
Figure 7B:
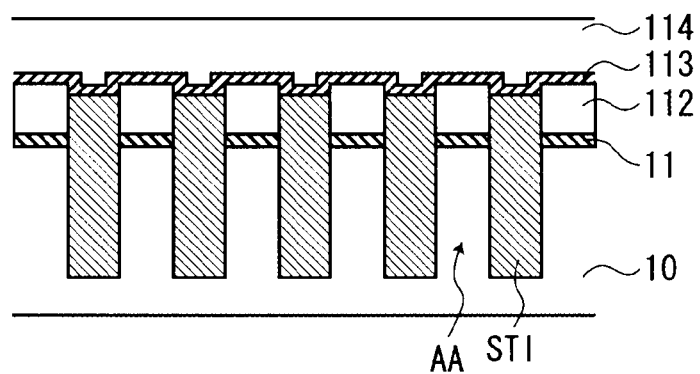
Figure 7C:
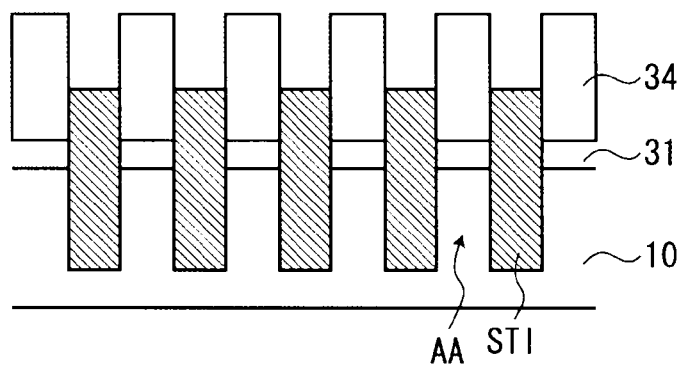

As shown in FIG. 7A-7C, a mask pattern (not illustrated) is formed to open the isolation insulator STI in the bit line contact area BCA, and the top electrode 34 is etched. Accordingly, as shown in FIG. 7C, each of the top electrodes is formed as only on each of the active area AA to be separated. The process mentioned above is called as separating the top electrode.

The inter-layer insulator, for example, a silicon oxide layer, is entirely deposited on the semiconductor substrate 10. An opening to expose the top electrode is formed in a region which the contact plug 35 is to be formed. A conductive material is embedded in the opening to form the contact plug 35.

The upper layer wiring 61 connected to the contact electrode is formed using well-known techniques, so that the nonvolatile semiconductor memory device as shown in FIG. 2 is completed.

Effects of Embodiment

According to the semiconductor memory device and the method of fabricating the semiconductor memory device, at least effects mentioned below are obtained. First, an aspect ratio of the bit line contact BC can be smaller. As mentioned above, the bit line contact BC is formed by forming the contact plug 35 on the upper surface of the top electrode 34. Here, a height of the contact plug 35 is a distance from the bottom surface of the upper layer wiring to the upper surface of the top electrode 34. Namely, a contact plug 35 can be decreased the height which is corresponding to the height of the top electrode 34. In such a manner, process margin can be improved and the shape of the contact plug can be stabilized.

Secondly, resistance of the contact electrode BC can be decreased. The top electrode 34 with a wider width than the diameter of the contact plug 35 is formed on the bottom portion of the contact electrode BC, which leads to totally decrease the contact electrode BC. Further, it is not necessary to widen the diameter of the contact plug 35 in order to decrease contact resistance. Therefore, the structure has a great advantage for shrinking of a nonvolatile semiconductor memory device.

Thirdly, the method is superior to decreasing production cost. The top electrode 34 can be simultaneously formed with forming the floating gate electrode 12. As a result, the shape of the contact electrode can be improved and the contact resistance can be lowered without increasing the processing steps.

Second Embodiment

It is different from the first embodiment that resistivity of a connection electrode of a fourth second embodiment, which is larger than that of the first embodiment, is embedded in an opening EII. Further, explanation is omitted on the same constitution with the first embodiment and the same reference numerals are attached in the constitution.

[Plane Structure]

A plane structure of the second embodiment is the same as that of the first embodiment, therefore, explanation is omitted.

[Cross-Sectional Structure]

Figure 8A:
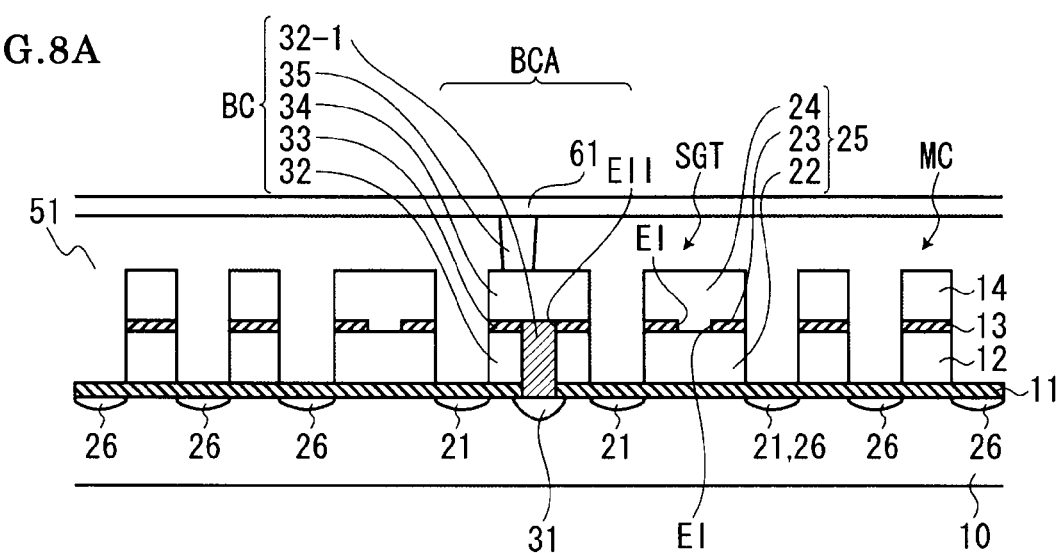
FIGS. 8A, 8B, 8C are cross-sectional views taken along the A-A line, the B-B line and the C-C line in FIG. 1, respectively, showing a NAND flash memory according to a second embodiment.
Figure 8B:
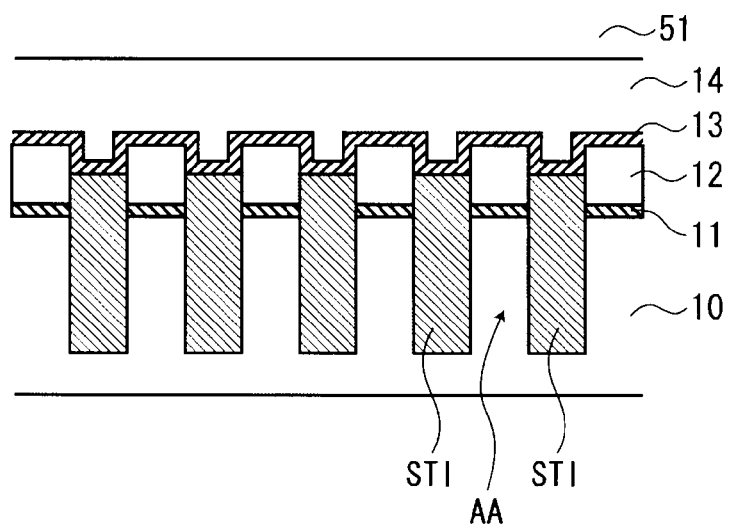
Figure 8C:
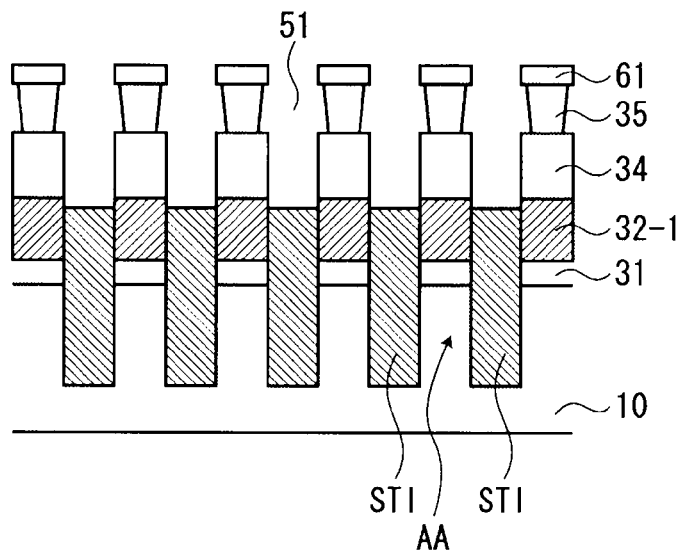

A cross-sectional structure of the memory cell array in the semiconductor memory device according to the second embodiment, for example, is described by using FIGS. 8A-8C. FIGS. 8A-8C are cross sectional views showing the memory cell array taken along the A-A line, the B-B line and the C-C line in FIG. 1, respectively, according to the second embodiment.

As shown in FIG. 8A, the contact electrode BC is formed in the bit line contact area BCA. The contact electrode BC includes the bottom electrode 32, the inter-gate insulator 33, a connection electrode 32-1, the top electrode 34 and the contact plug 35. The bottom electrode 32 is disposed on the upper surface of the semiconductor substrate 10 via the gate insulator 11 and is formed of the same material as the floating gate electrode 12. The inter-gate insulator 33 is disposed on the bottom electrode 32. The connection electrode 32-1 is disposed in the opening EII which penetrates into the inter-gate insulator 33, the bottom electrode 32 and the gate insulator 11 to expose the surface of the semiconductor substrate 10. The top electrode 35 is disposed on the connection electrode 32-1 and the inter-gate insulator 33, and is composed of the same material as the control gate electrode 14. In addition, a position of an upper surface of the top electrode 34 is nearly the same as positions of an upper surface of the bottom electrode 32 and an upper surface of the floating electrode 12.

Further, the gate insulator 11 is disposed between the contact electrode 32 and the semiconductor substrate 10 at an edge portion of the contact electrode in the bit line contact BC. The gate insulator 11 disposed at the edge portion can enlarge an alignment margin of the bottom electrode 32 at the opening EII.

In addition, the connection diffusion layer 31 is formed on the surface of the semiconductor substrate 10 positioned immediately beneath the opening EII. The connection diffusion layer 31 may be connected to the diffusion layer 21. However, it is no problem that the two diffusion layers are set to be in a distance which electrical potential can be transferred from the contact electrode BC to the diffusion layer 21, when the connection diffusion layer 31 is separated to the diffusion layer 21. In a case of applying 2.5V to the bit line contact BC, for example, an inversion layer is formed immediately beneath the gate insulator 11 formed between the bottom electrode 32 and the semiconductor substrate 10, so that the connection diffusion layer 31 is connected to the diffusion layer 21. In the figures including mentioned after, a case which the diffusion layer 31 is separated to the diffusion layer 21, for example, is described for easily watching the structure.

The inter-layer insulator 51 is disposed to cover a portion between the memory cells MC. The upper layer wiring 61 is disposed on the insulator 51 to connect to the contact electrode BC via the contact plug 35.

Figure 9:
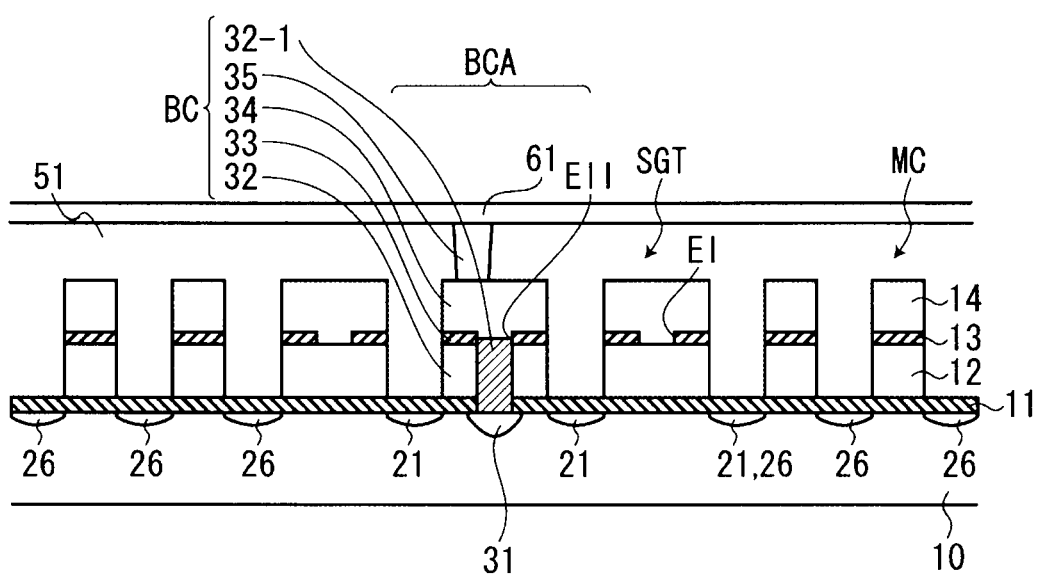
FIG. 9 is a cross-sectional view taken along the A-A line in FIG. 1 showing a NAND flash memory according to a modification of the second embodiment.

Further, as shown in FIG. 8A, a height of the upper surface of the connection electrode 32-1 is nearly the same as that of the upper surface of the of the inter-gate insulator 33, however, the case is not restricted as mentioned before. As shown in FIG. 9, the height of the upper surface of the connection electrode 32-1 may be lower than that of the upper surface of the inter-gate insulator 33, for example. Further, the height of the upper surface of the connection electrode 32-1 may be lower than that of the upper surface of the bottom electrode 32.

As shown in FIG. 8B, the isolation insulators STI are disposed in the surface area of the semiconductor substrate 10. The semiconductor substrate 10 sandwiched by each of the isolation insulators STI is each of the active areas AA.

The floating gate electrode 12 is disposed on the semiconductor substrate 10 via the gate insulator 11. The lower portion side surface of the floating gate electrode 12 is contacted to the isolation insulator STI. Further, the upper portion of the floating gate electrode is protruded from an upper surface of the isolation insulator STI. The inter-gate insulator 13 is continuously disposed on the upper surface of the isolation insulator STI and both upper surface and side surface of the floating gate electrode 12. The control gate electrode 14 is formed on the inter-gate insulator 13.

As shown in FIG. 8C, the isolation insulator STI is disposed in the surface area of the semiconductor 10 as a cross-sectional shape of the bit line contact area BCA. The semiconductor 10 interposed by the isolation insulators STI is the active area AA. The connection diffusion layer is formed in a surface area of the semiconductor 10.

The connection electrode 32-1 is disposed to contact with the surface of the connection diffusion layer 31 in the semiconductor substrate 10. A portion of a side surface of the connection electrode 32-1 is contacted to the isolation insulator STI. Further, an upper surface of the connection electrode 32-1 is higher than the upper surface of the isolation insulator STI, the connection electrode 32-1 formed on each active area AA is separated by the isolation insulator STI. The top electrode 34 is disposed to contact to the upper surface of the connection electrode 32-1 and the contact plug 35 is disposed to contact to the upper surface of top electrode 34. The upper layer wiring 61 is disposed to contact to an upper surface of the contact plug 35. In addition, the contact plug 35 and the upper layer wiring 61 are covered with the inter-layer insulator 51.

[Fabricating Method]

Figure 10A:
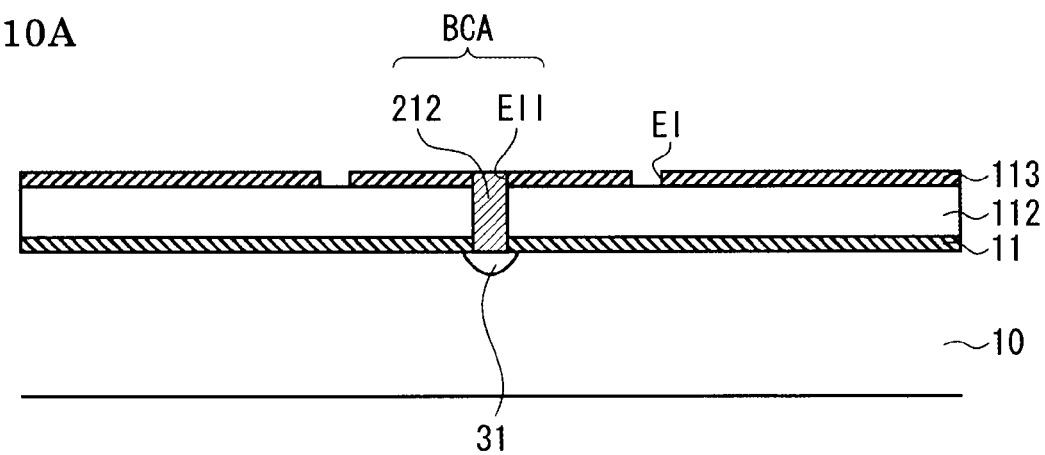
FIGS. 10A, 10B, 10C are cross-sectional views taken along the A-A line, the B-B line and the C-C line in FIG. 1, respectively, showing a fabricating process of a NAND flash memory according to a second embodiment.
Figure 10B:
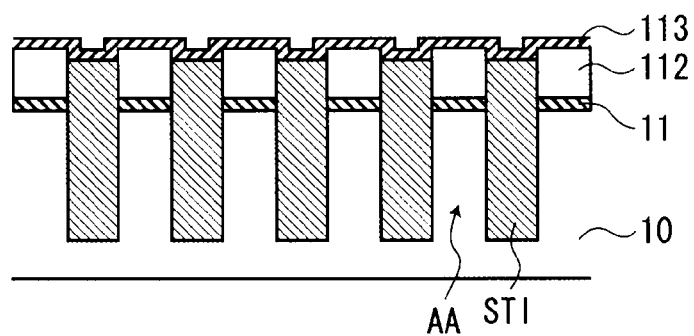
Figure 10C:
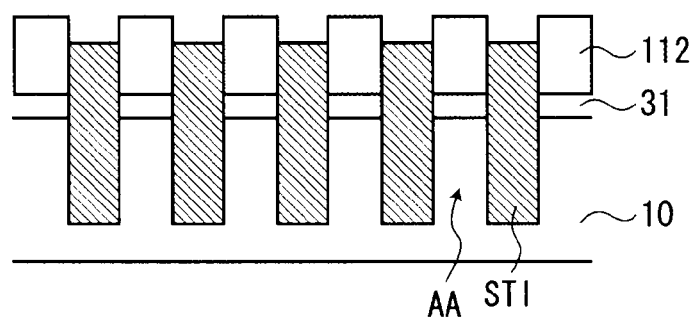
Figure 11A:
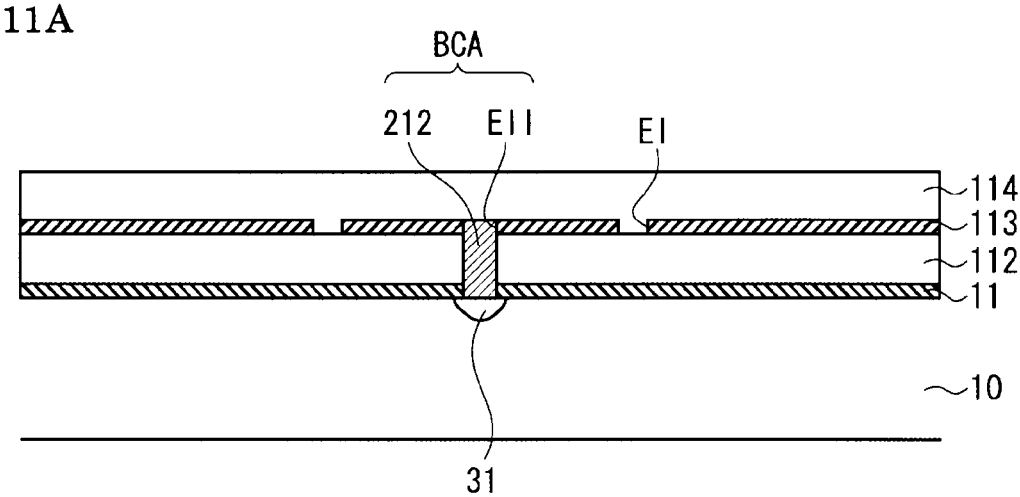
FIG. 11 is a cross-sectional view showing the fabricating process of the NAND flash memory successively from FIG. 10 according to the second embodiment.

Next, a method of fabricating the semiconductor memory device in this embodiment is explained by using FIGS. 10-11. FIGS. 10A-11A are cross-sectional views taken along the A-A line in FIG. 1. FIGS. 10B-10B are cross-sectional views taken along the B-B line in FIG. 1. FIGS. 10C-10C are cross-sectional views taken along the C-C line in FIG. 1.

As processing steps for forming the opening EII (FIG. 4) is the same as the first embodiment, the explanation is omitted.

As shown in FIG. 10A-10D, a conductive material 212 composed of tungsten, for example, is deposited on the surface of the semiconductor substrate 10. After that, the conductive material 212 is anisotropically etched to leave the portion of the conductive material 212 only in the opening EII. When etching the conductive material 212, over-etching may be performed to prevent from generating residues. Accordingly, as shown in FIG. 9, a height of an upper surface of the conductive material 212 is lower than the insulator 113. The conductive material 212 and the insulator 113 are the connection electrode 32-1 and the inter-gate insulator 33, respectively, as shown later. The height of an upper surface of the conductive material 212 may be lower than that of the first poly-crystalline silicon film 112 which is the bottom electrode 32, as shown later.

In addition, a material with lower resistivity than the first poly-crystalline silicon film 112 may be available as the conductive material 212 to decrease resistivity. A barrier metal, titanium, titanium nitride or the like, for example, may be formed between the conductive material 212 and the semiconductor substrate 10.

Figure 11B:
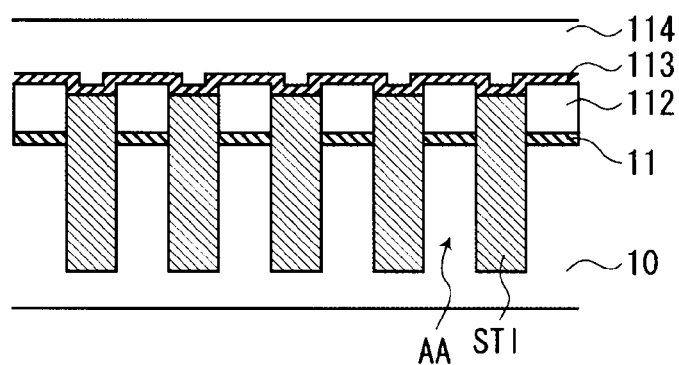
Figure 11C:
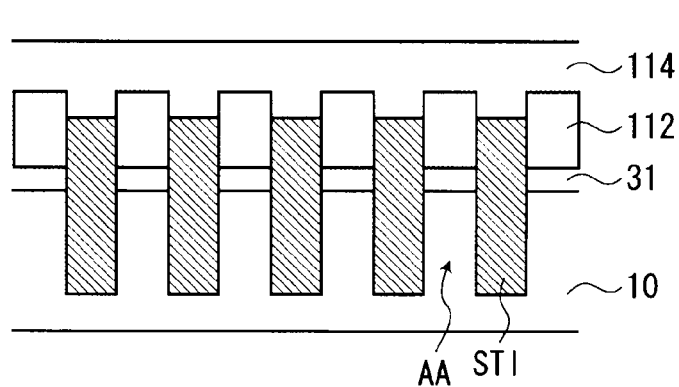

As shown in FIG. 11A-11C, a second poly-crystalline silicon film 114 are deposited in the opening EI, on the first poly-crystalline silicon film 112 exposed from the opening EI and in the opening EII.

As a result, the first poly-crystalline silicon film 112 and the second poly-crystalline silicon film 114 are connected via the opening EI and the connection diffusion layer 31 in the semiconductor substrate 10, the first poly-crystalline silicon film 112 and the second poly-crystalline silicon film 114 are connected via the opening EII.

The processing steps as the same as those of the first embodiment are carried out. The nonvolatile semiconductor memory device according to the second embodiment is completed.

Effects of Embodiment

According to the semiconductor memory device and the method of fabricating the semiconductor memory device, at least a fourth effect, in addition to the three effects on the first embodiment, can be obtained. The resistance of the contact electrode BC can be lowered as the fourth effect.

As mentioned above, the connection electrode 32-1 with lower resistivity than that of the bottom electrode 32 is embedded in the opening EII. Consequently, the resistance of the contact electrode can be further lowered. In addition, the contact electrode can be lowered by using a material with lower resistivity than that of the top electrode 34.

Third Embodiment

It is different from the first embodiment that the top electrode and the integrate insulator are not included in the first and second embodiment in the third embodiment. Further, explanation is omitted on the same constitution with the first embodiment and the same reference numerals are attached in the constitution.

[Plane Structure]

A plane structure of the second embodiment is the same as that of the first embodiment, therefore, explanation is omitted.

[Cross-Sectional Structure]

Figure 12A:
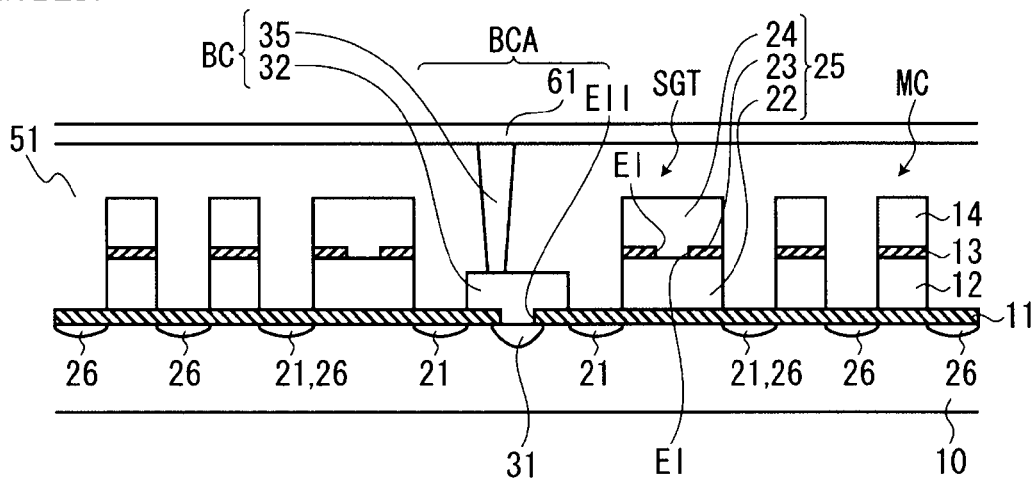
FIGS. 12A, 12B, 12C are cross-sectional views taken along the A-A line, the B-B line and the C-C line in FIG. 1, respectively, showing a NAND flash memory according to a third embodiment.
Figure 12B:
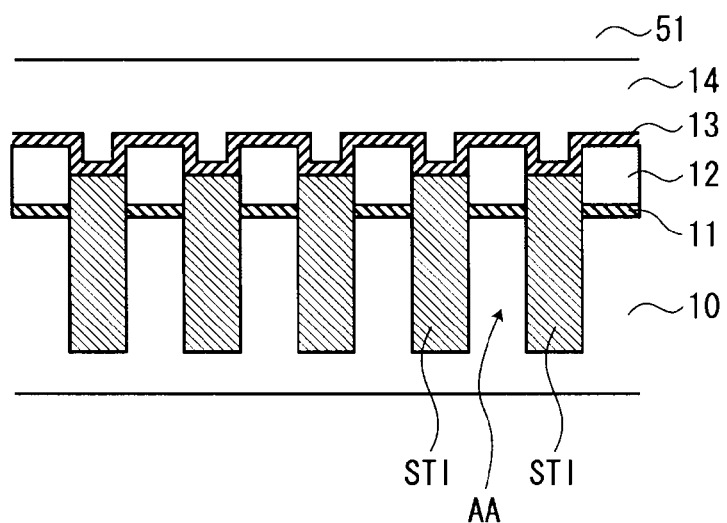
Figure 12C:
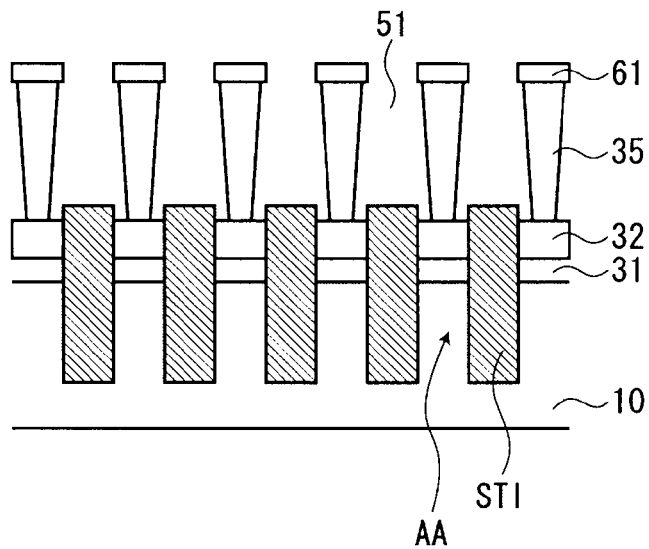

A cross-sectional structure of the memory cell array in the semiconductor memory device according to the third embodiment, for example, is described by using FIGS. 12A-12C. FIGS. 12A-12C are cross sectional views showing the memory cell array taken along the A-A line, the B-B line and the C-C line in FIG. 1, respectively, according to the third embodiment.

As shown in FIG. 12A, the contact electrode BC is disposed in the bit line contact area BCA. The contact electrode BC is disposed above the semiconductor substrate on which the gate insulator 11 with the opening EII is formed. In other words, the contact electrode BC is contacted to the gate insulator 11 and semiconductor substrate 10 in the opening EII. In addition, the contact electrode BC is constituted with the bottom electrode 32, which is formed of the same material as the floating electrode 13, and the contact plug 35 which is contacted to the upper surface of the bottom electrode 32. The upper surface of the bottom electrode 32 is lower than the upper surfaces of the floating gate electrode 12 and the lower gate electrode 22.

Further, the gate insulator 11 is disposed between the contact electrode 32 and the semiconductor substrate 10 at an edge portion of the contact electrode 32 in the bit line contact BC. It is possible to enlarge an alignment margin between the bottom electrode 32 and the opening EII in other to be formed the gate insulator 11 at the end portion of the contact electrode 32.

Figure 22:
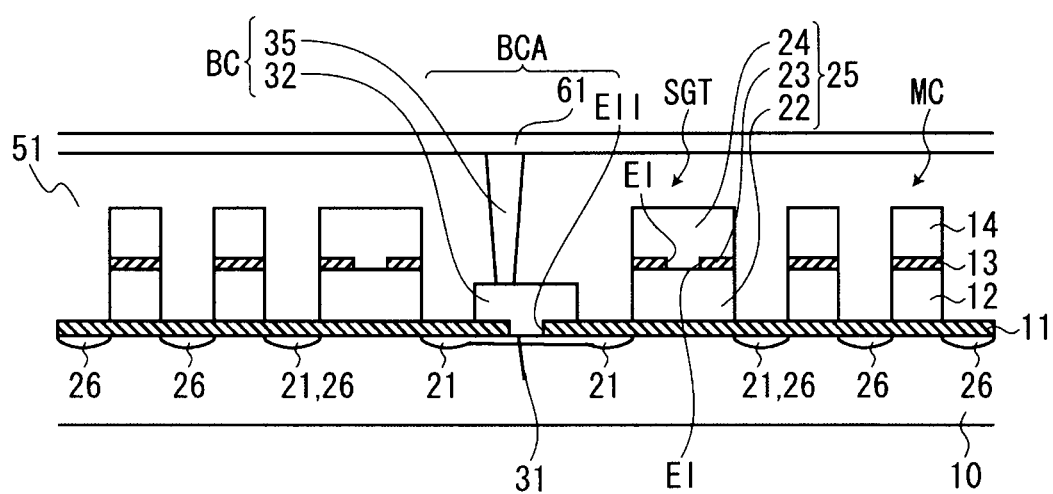
FIG. 22 is cross sectional views taken along the A-A line in FIG. 1, showing a NAND flash memory according to a modification of the third embodiment.

In addition, the connection diffusion layer 31 is formed on the surface of the semiconductor substrate 10 positioned immediately beneath the opening EII. The connection diffusion layer 31 may be connected to the diffusion layer 21 (As shown FIG. 22). However, it is no problem that the two diffusion layers are set to be in a distance which electrical potential can be transferred from the contact electrode BC to the diffusion layer 21, when the connection diffusion layer 31 is separated to the diffusion layer 21. In a case of applying 2.5V to the bit line contact BC, for example, an inversion layer is disposed immediately beneath the gate insulator 11 formed between the bottom electrode 32 and the semiconductor substrate 10, so that the connection diffusion layer 31 is connected to the diffusion layer 21. In the figures including mentioned after, a case which the diffusion layer 31 is separated to the diffusion layer 21, for example, is described for easily watching the structure.

The inter-layer insulator 51 is disposed to cover a portion between the memory cells MC. The upper layer wiring 61 is disposed in the inter-layer insulator 51 to connect to the contact electrode BC via the contact plug 35.

As shown in FIG. 12B, the isolation insulators STI are disposed in the surface area of the semiconductor substrate 10. The semiconductor substrate 10 sandwiched by each of the isolation insulators STI is each of the active areas AA.

The floating gate electrode 12 is disposed on the semiconductor substrate 10 via the gate insulator 11. The lower portion side surface of the floating gate electrode 12 is contacted to the isolation insulator STI. Further, the upper portion of the floating gate electrode is protruded from an upper surface of the isolation insulator STI. The inter-gate insulator 13 is continuously disposed on the upper surface of the isolation insulator STI and both upper surface and side surface of the floating gate electrode 12. The control gate electrode 14 is disposed on the inter-gate insulator 13.

As shown in FIG. 12C, the isolation insulator STI is disposed in the surface area of the semiconductor 10 as a cross-sectional shape of the bit line contact area BCA. The semiconductor 10 interposed by the isolation insulators STI is the active area AA. The connection diffusion layer 31 is disposed in a surface area of the semiconductor 10.

The bottom electrode 32 is disposed to contact with the surface of the connection diffusion layer 31 in the semiconductor substrate 10. A portion of a side surface of the bottom electrode 32 is contacted to the isolation insulator STI. Further, the upper surface of the bottom electrode 32 is higher than the upper surface of the isolation insulator STI, the bottom electrode 32-1 disposed on each active area AA is separated by the isolation insulator STI. The upper layer wiring 61 is disposed to contact to the upper surface of the contact plug 35. In addition, the contact plug 35 and the upper layer wiring 61 are covered with the inter-layer insulator 51.

[Fabricating Method]

Next, a method of fabricating the semiconductor memory device in a third embodiment is explained by using FIGS. 13-16. FIGS. 13A-16A are cross-sectional views taken along the A-A line in FIG. 1. FIGS. 13B-17B are cross-sectional views taken along the B-B line in FIG. 1. FIGS. 13C-17C are cross-sectional views taken along the C-C line in FIG. 1.

N-type impurities (not illustrated) are introduced into the semiconductor substrate 10, for example, using ion implantation or the like to form an n-well area. P-type impurities, boron or the like, are introduced into the n-well area in the semiconductor substrate 10, for example, using ion implantation or the like to form a p-well area.

Figure 13A:
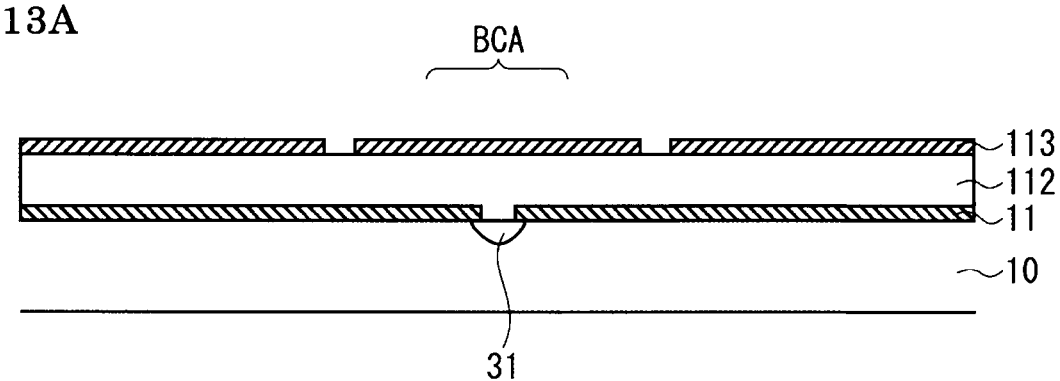
FIGS. 13A, 13B, 13C are cross-sectional views taken along the A-A line, the B-B line and the C-C line in FIG. 1, respectively, showing a fabricating process of a NAND flash memory according to the third embodiment.
Figure 13B:
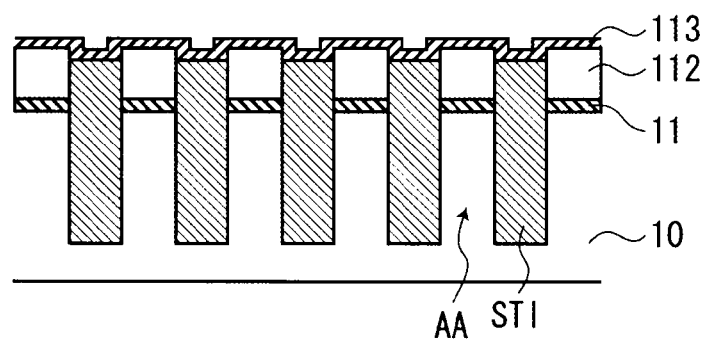
Figure 13C:
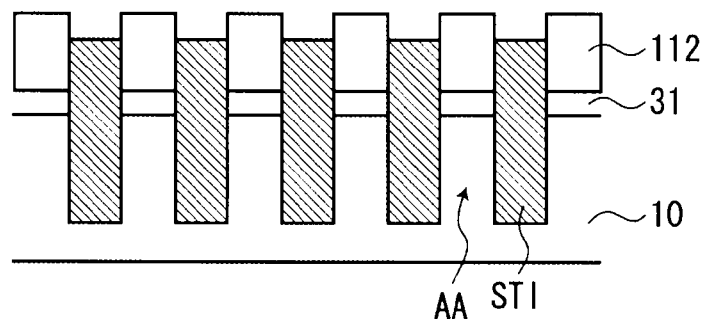

As shown in FIGS. 13A-13C, the gate insulator 11, for example, a silicon oxide film is formed on the surface of the semiconductor substrate 10 by thermal oxidation. A mask pattern (not illustrated) is formed for removing a portion of the silicon oxide film to expose the silicon substrate 10 in the bit line contact area BCA by lithography. The opening EII formed by removing the silicon oxide film using the mask pattern to expose the surface of the silicon substrate 10. The connection diffusion layer 31 is formed using the mask pattern. Forming the opening EII is called an EII process. After that, the mask pattern is removed.

A first poly-crystalline silicon film 112, for example, is formed on the semiconductor substrate 10 exposed by the above process and the gate insulator 11. The first poly-crystalline silicon film 112, the silicon oxide film and the semiconductor substrate 10 are selectively etched to form a trench groove, and an insulator is formed in the groove to form the isolation insulator STI.

After the upper surface of the isolation insulator STI is lowered below the upper surface of the first poly-crystalline silicon film 112, an insulator formed of an ONO film, for example, is deposited on the first poly-crystalline silicon film 112 and the isolation insulator. Both the insulator 113 in which selection gate transistor SGT is formed and the insulator 113 in the bit line contact area BCA are removed to form the opening EI. Forming the opening EI is called as the EI process.

Figure 14A:
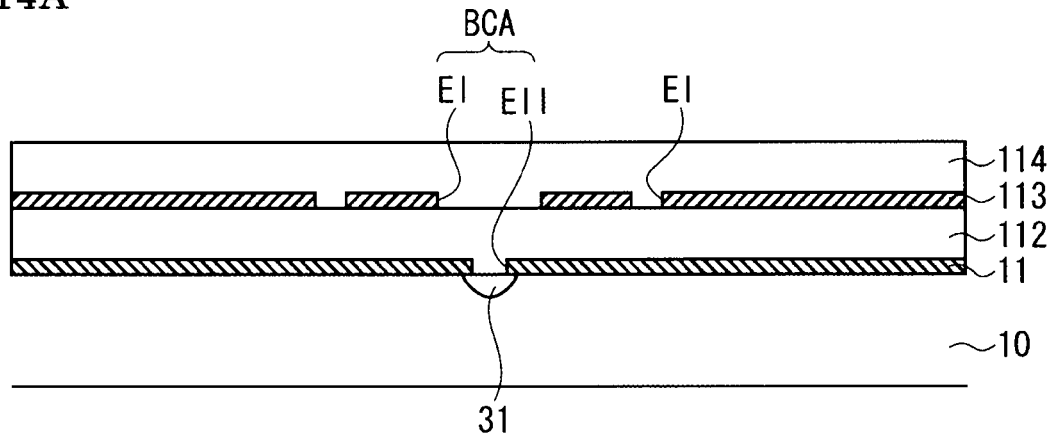
FIG. 14 is a cross-sectional view showing the fabricating process of the NAND flash memory successively from FIG. 13 according to the third embodiment.
Figure 14B:
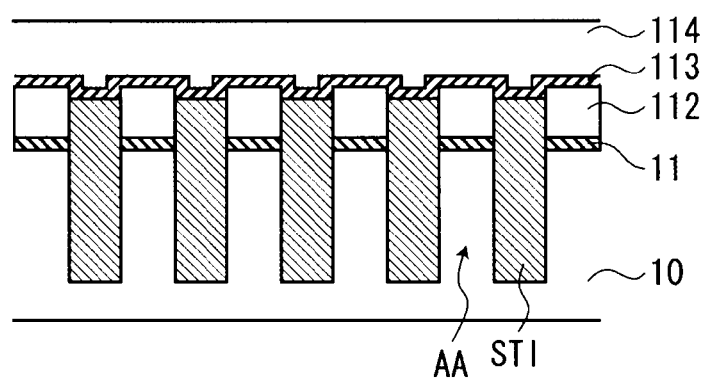
Figure 14C:
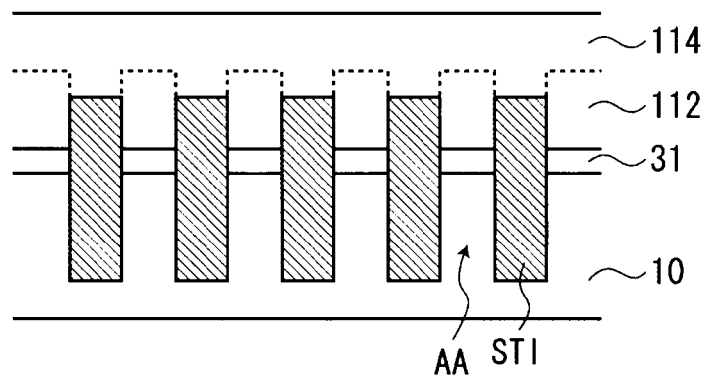
Figure 15A:
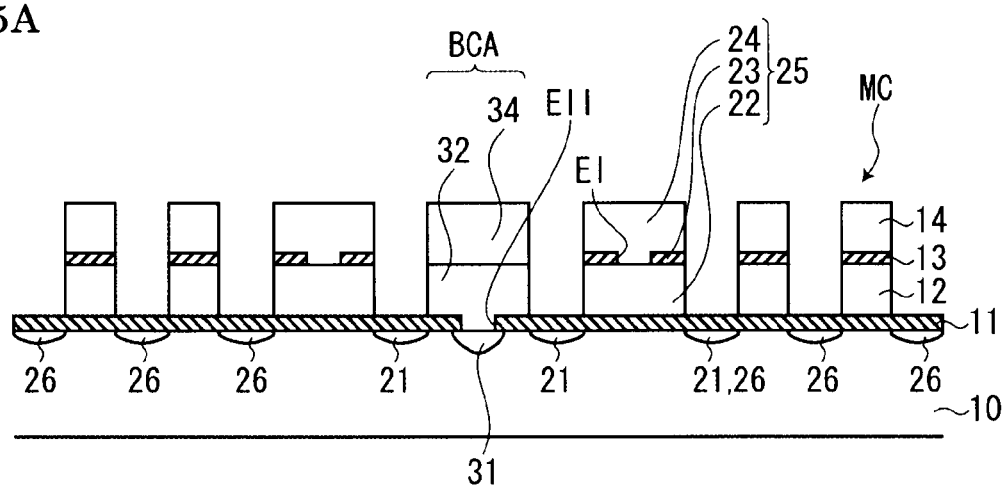
FIG. 15 is a cross-sectional view showing the fabricating process of the NAND flash memory successively from FIG. 14 according to the third embodiment.
Figure 15B:
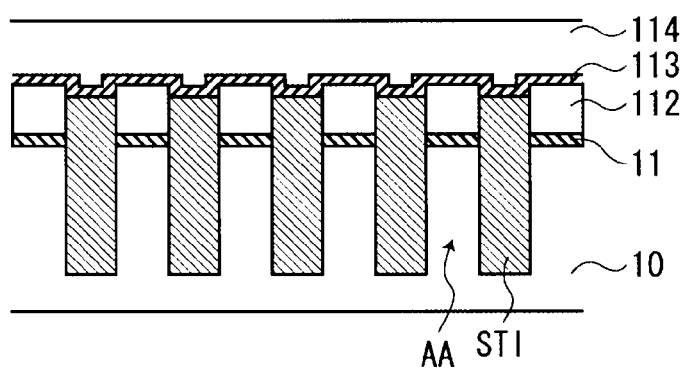
Figure 15C:
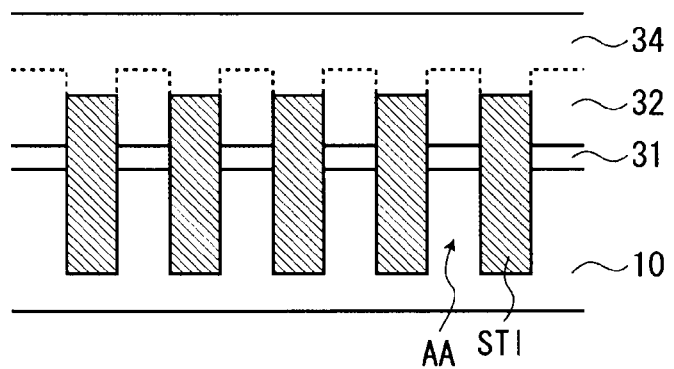

As shown in FIG. 14A-14C, the second poly-crystalline silicon film 114 are deposited in the opening EI, on the first poly-crystalline silicon film 112 exposed from the opening EI. As a result, the first poly-crystalline silicon film 112 and the second poly-crystalline silicon film 114 are connected via the opening EI As shown in FIG. 15A-15C, a mask material formed of a silicon nitride film (not illustrated), for example, is formed on the second poly-crystalline silicon 114. Further, a mask pattern extended to the word line direction is formed in the bit line contact area BCA as well as forming patterns of the word line WL and the selection gate.

After that, the first poly-crystalline silicon film 112, the insulator 113, the second poly-crystalline silicon film 114 and the mask material are removed by etching using the mask pattern. The gate electrode 25 of the memory cell MC and the selection gate transistor SGT, and the contact electrode BC are formed.

Here, the first poly-crystalline silicon film 112 in the memory cell MC is the floating gate electrode 12, the insulator 113 is the inter-gate insulator 13, and the second poly-crystalline silicon film 114 is the control gate electrode 14. Further, the first poly-crystalline silicon film 112 in the selection gate transistor SGT is the lower layer gate electrode 22, the insulator 113 is the inter-gate insulator 23, and the second poly-crystalline silicon film 114 is the upper gate electrode 24. Further, the first poly-crystalline silicon film 112 in the contact electrode BC is the bottom electrode 32, the insulator 113 is the inter-gate insulator 33, and the second poly-crystalline silicon film 114 is the top electrode 34.

Arsenic or phosphorous, for example, as an impurity is implanted into the semiconductor substrate 10 by ion-implantation using the gate electrodes 25 of both the memory cell MC and the selection gate transistor SGT, and the top electrode 34 of the contact electrode BC as a mask. As a result, the source-drain diffusion layers 21, 26 are formed to sandwich a portion between the adjacent memory cells MC and the gate electrode 25.

Figure 16A:
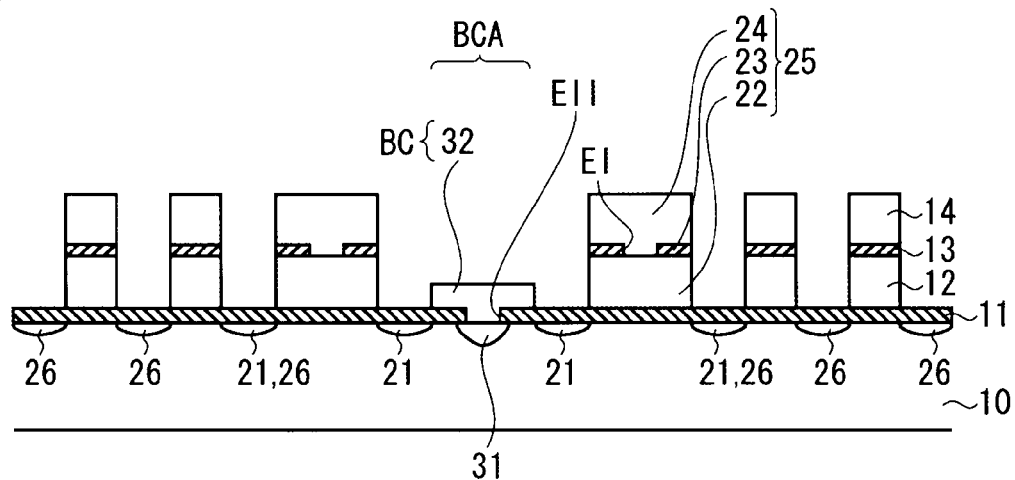
FIG. 16 is a cross-sectional view showing the fabricating process of the NAND flash memory successively from FIG. 15 according to the third embodiment.
Figure 16B:
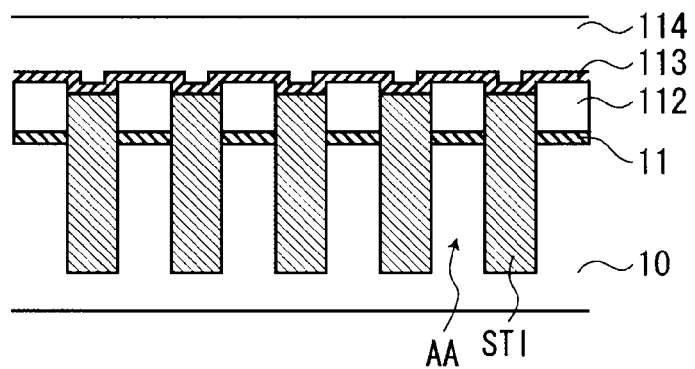
Figure 16C:
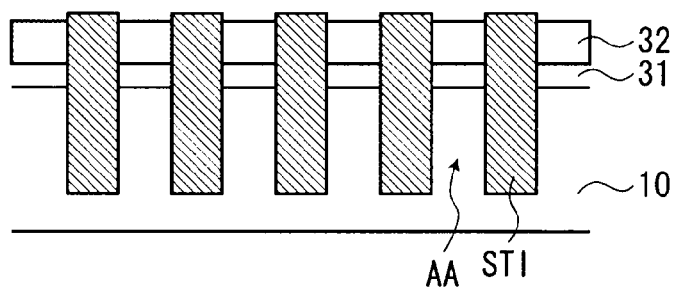

As shown in FIG. 16A-16C, a mask pattern (not illustrated) is formed to open the isolation insulator STI in the bit line contact area BCA, and the top electrode 34 is etched. Accordingly, as shown in FIG. 16C, each of the bottom electrodes 32 is formed as only on each of the active area AA to be separated. The process mentioned above is called as separating the bottom electrode.

The pattern is different from that in separating the top electrode in the first embodiment. The pattern can be used not only opening an area on the isolation insulator STI of the bit line contact area BCA but can entirely open all over the bit line contact area BCA so as to enlarge lithography margin.

Further, the insulator 113 in the bit line contact area BCA is removed in forming EI. In such a manner, both the first poly-crystalline silicon film 112 and the second poly-crystalline silicon film 114 may be etched. Consequently, removing can be easily performed.

Further, the source-drain diffusion layers 21, 26 are formed after separating the bottom electrode. As a result, the source-drain diffusion layer 21 can be entirely formed under the bottom electrode. This structure can be obtained as follow reason. A height of the bottom electrode is lower than the height of the gate electrodes of the memory cell MC and the selection gate transistor SGT, therefore, the impurity ions by ion-implantation pass through the bottom electrode and reach at the semiconductor substrate 10. As a result, the connection diffusion layer 31 and the source-drain layer 21 can be connected each other, so that electrical potential of the contact electrode BC can be effectively transferred to the source-drain layer 21.

The inter-layer insulator 51, for example, a silicon oxide layer, is entirely deposited on the semiconductor substrate 10. Successively, an opening to expose the top electrode is formed in a region which the contact plug 35 is formed. A conductive material is embedded in the opening to form the contact plug 35.

The upper layer wiring 61 connected to the contact electrode BC is formed using well-known techniques, so that the nonvolatile semiconductor memory device as shown in FIG. 12 is completed.

Effects of Embodiment

According to the semiconductor memory device and the method of fabricating the semiconductor memory device, at least a fifth effect, in addition to the four effects included in the first embodiment, the second embodiment and the third embodiment, can be obtained. The resistance of the contact electrode BC can be lowered as the fourth effect. Processing the contact electrode can be easily obtained.

As mentioned above, the pattern in separating the bottom electrode is different from that in separating the top electrode according to the first embodiment. The pattern can be used not only opening an area on the isolation insulator STI of the bit line contact area BCA but can entirely open all over the bit line contact area BCA so as to enlarge lithography margin.

Fourth Embodiment

It is different from the third embodiment that resistivity of a connection electrode of a fourth embodiment, which is larger than that of the third embodiment, is embedded in an opening EII. Further, explanation is omitted on the same constitution with the first embodiment, the second embodiment and the third embodiment, and the same reference numerals are attached in the constitution.

[Plane Structure]

A plane structure of the fourth third embodiment is the same as that of the first embodiment, therefore, explanation is omitted.

[Cross-Sectional Structure]

Figure 17A:
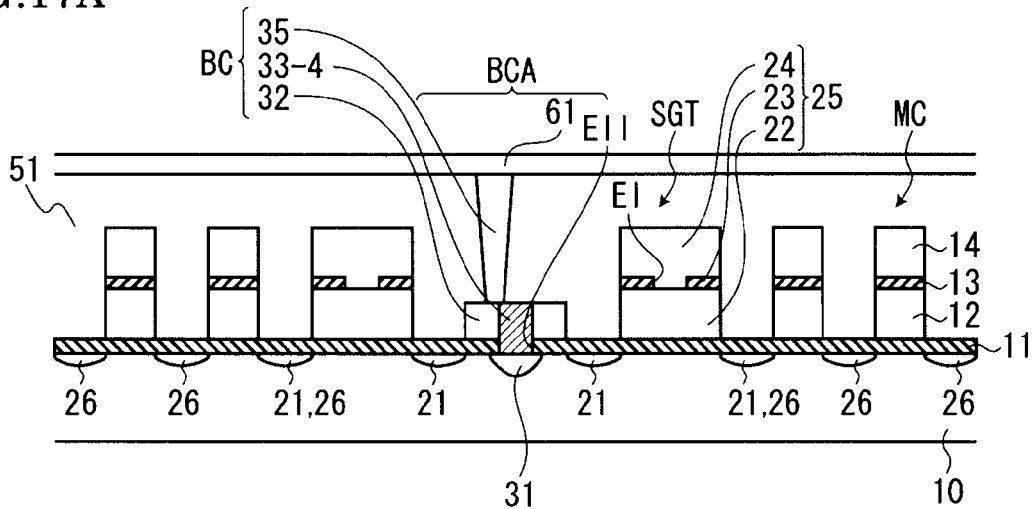
FIGS. 17A, 17B, 17C are cross-sectional views taken along the A-A line, the B-B line and the C-C line in FIG. 1, respectively, showing a NAND flash memory according to a fourth embodiment.
Figure 17B:
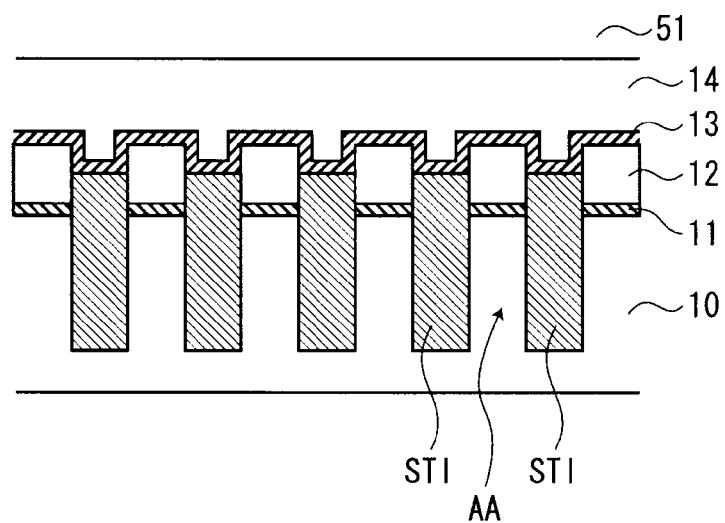
Figure 17C:
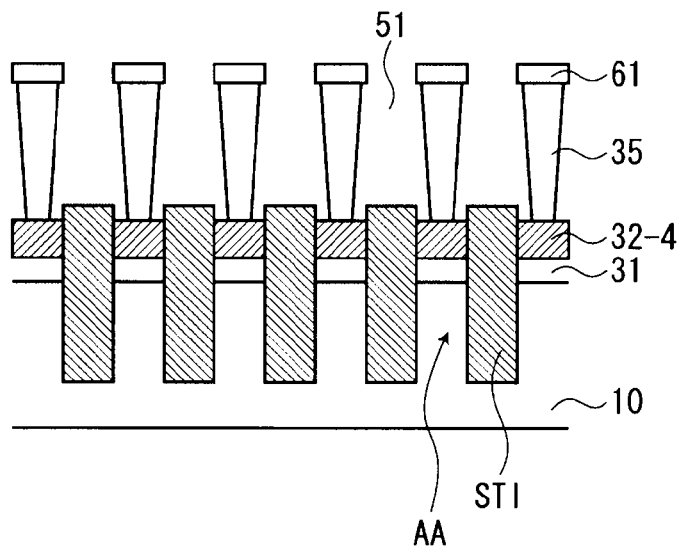

Across-sectional structure of the memory cell array in the semiconductor memory device according to a fourth embodiment, for example, is described by using FIGS. 17A-17C. FIGS. 17A-17C are cross sectional views showing the memory cell array taken along the A-A line, the B-B line and the C-C line in FIG. 1, respectively, according to the second embodiment.

As shown in FIG. 17A, the contact electrode BC is disposed in the bit line contact area BCA. The contact electrode BC is disposed above the semiconductor substrate 10 and is formed of the same material as the bottom electrode 32, a connection electrode 33-4 and the contact plug 35. The bottom electrode 32 is disposed on the gate insulator 13 with the opening EII and is formed of the same material as the floating electrode 13. The connection electrode 33-4 is penetrated into the bottom electrode 32 and the gate insulator 13 so as to contact to the semiconductor substrate 10 via the opening EII which exposed the surface of the semiconductor substrate 10. The contact plug 35 is contacted to the bottom electrode 32 and the upper surface of the connection electrode 33-4. A side surface of the bottom electrode 32, which is exposed by the opening EII, and aside surface of the connection electrode 33-4 disposed in the opening EII are electrically connected each other. Further, upper surfaces of the bottom electrode 32 and the connection electrode 33-4 is lower than the upper surfaces of the floating gate electrode 12 and the lower gate electrode 22. The contact plug 35 may be connected to either the bottom electrode 32 or the connection electrode 33-4.

Further, the gate insulator 11 is disposed between the bottom electrode 32 and the semiconductor substrate 10 at an edge portion of the bottom electrode 32 in the contact electrode BC. The gate insulator 11 disposed at the edge portion can enlarge an alignment margin between the bottom electrode 32 and the opening EII.

Figure 23:
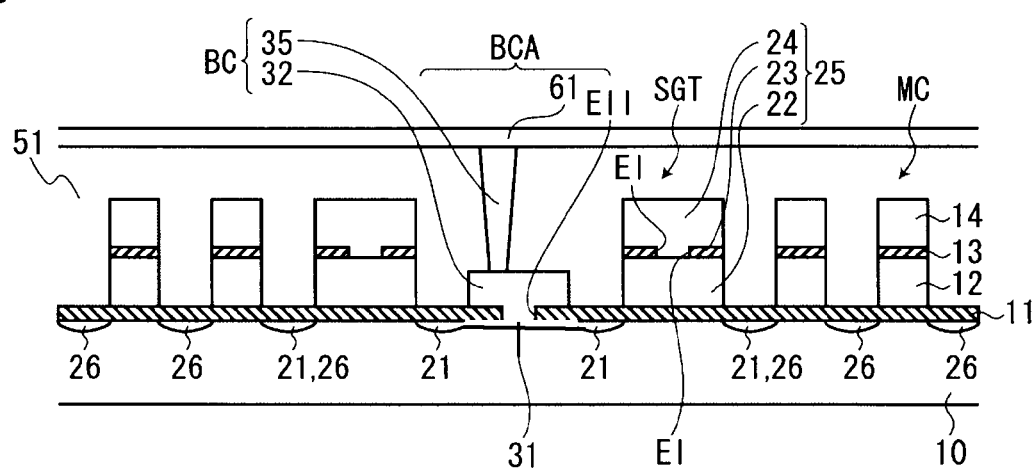
FIG. 23 is cross sectional views taken along the A-A line in FIG. 1, showing a NAND flash memory according to a modification of the fourth embodiment.

In addition, the connection diffusion layer 31 is disposed on the surface of the semiconductor substrate 10 positioned immediately beneath the opening EII. The connection diffusion layer 31 may be connected to the diffusion layer 21 (As shown FIG. 23). However, it is no problem that the two diffusion layers are set to be in a distance which electrical potential can be transferred from the contact electrode BC to the diffusion layer 21, when the connection diffusion layer 31 is separated to the diffusion layer 21. In a case of applying 2.5V to the bit line contact BC, for example, an inversion layer is formed immediately beneath the gate insulator 11 formed between the bottom electrode 32 and the semiconductor substrate 10, so that the connection diffusion layer 31 is connected to the diffusion layer 21. In the figures including mentioned after, a case which the diffusion layer 31 is separated to the diffusion layer 21, for example, is described for easily watching the structure.

The inter-layer insulator 51 is formed to cover a portion between the memory cells MC. The upper layer wiring 61 is disposed in the inter-layer insulator 51 to connect to the contact electrode.

As shown in FIG. 17B, the isolation insulators STI are disposed in the surface area the semiconductor substrate 10. The semiconductor substrate 10 sandwiched by each of the isolation insulators STI is each of the active areas AA.

The floating gate electrode 12 is disposed on the semiconductor substrate 10 via the gate insulator 11. The lower portion side surface of the floating gate electrode 12 is contacted to the isolation insulator STI. Further, the upper portion of the floating gate electrode is protruded from an upper surface of the isolation insulator STI. The inter-gate insulator 13 is continuously disposed on the upper surface of the isolation insulator STI and both upper surface and side surface of the floating gate electrode 12. The control gate electrode 14 is disposed on the inter-gate insulator 13.

As shown in FIG. 17C, the isolation insulator STI is disposed in the surface area of the semiconductor 10 as a cross-sectional shape of the bit line contact area BCA. The semiconductor 10 interposed by the isolation insulators STI is the active area AA. The connection diffusion layer 31 is disposed in the surface area of the semiconductor 10.

The connection electrode 33-4 is disposed to contact with the surface of the connection diffusion layer 31 in the semiconductor substrate 10. A portion of a lower side surface of the connection electrode 33-4 is contacted to the isolation insulator STI. Further, an upper surface of the connection electrode 33-4 is lower than the upper surface of the isolation insulator STI, the connection electrode 33-4 disposed on each active area AA is separated by the isolation insulator STI.

Each of the contact plugs 35 is formed to contact to the upper surface of each of the connection electrodes 33-4. In addition, the upper layer wiring 61 is disposed to be contacted to the contact plug 35. The upper layer wiring 61 and the contact plug 35 are covered with the inter-layer insulator 51.

[Fabricating method]

Next, a method of fabricating the semiconductor memory device in this embodiment is explained by using FIGS. 18-21. FIGS. 18A-21A are cross-sectional views taken along the A-A line in FIG. 1. FIGS. 18B-21B are cross-sectional views taken along the B-B line in FIG. 1. FIGS. 18C-21C are cross-sectional views taken along the C-C line in FIG. 1.

As processing steps for forming the opening EII (FIG. 4) is the same as the first embodiment, the explanation is omitted.

Figure 18A:
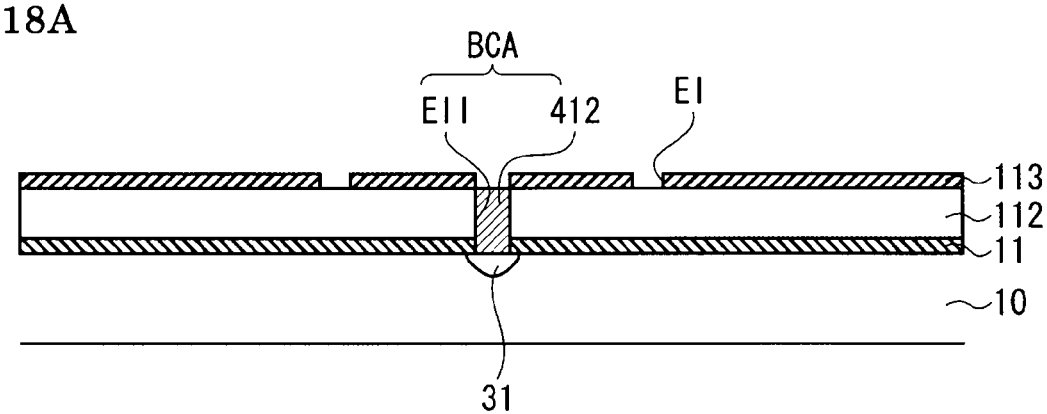
FIGS. 18A, 18B, 18C are cross-sectional views taken along the A-A line, the B-B line and the C-C line in FIG. 1, respectively, showing a fabricating process of a NAND flash memory according to the fourth embodiment.
Figure 18B:
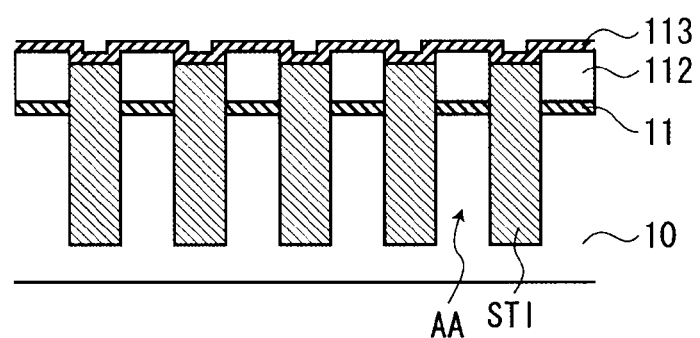
Figure 18C:
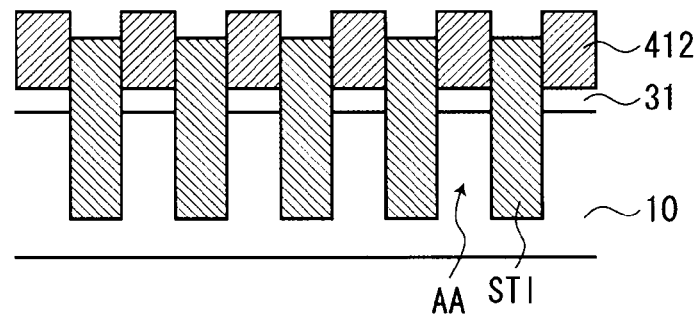

As shown in FIG. 18A-18C, a conductive material 412 composed of tungsten, for example, is deposited on the surface of the semiconductor substrate 10. After that, the conductive material 412 is anisotropically etched to leave the portion of the conductive material 212 only in the opening EII. When etching the conductive material 412, over-etching may be performed to prevent from generating residues. Accordingly, a height of an upper surface of the conductive material 412 is lower than the insulator 113. The conductive material 412 and the insulator 113 are the connection electrode 32-1 and the inter-gate insulator 33, respectively, as shown later. The height of an upper surface of the conductive material 412 may be lower than that of the first poly-crystalline silicon film 112 which is the bottom electrode 32, as shown later.

In addition, a material with lower resistivity than the first poly-crystalline silicon film 112 may be available as the conductive material 412 to decrease resistivity. A barrier metal, titanium, titanium nitride or the like, for example, may be formed between the conductive material 412 and the semiconductor substrate 10.

Figure 19A:
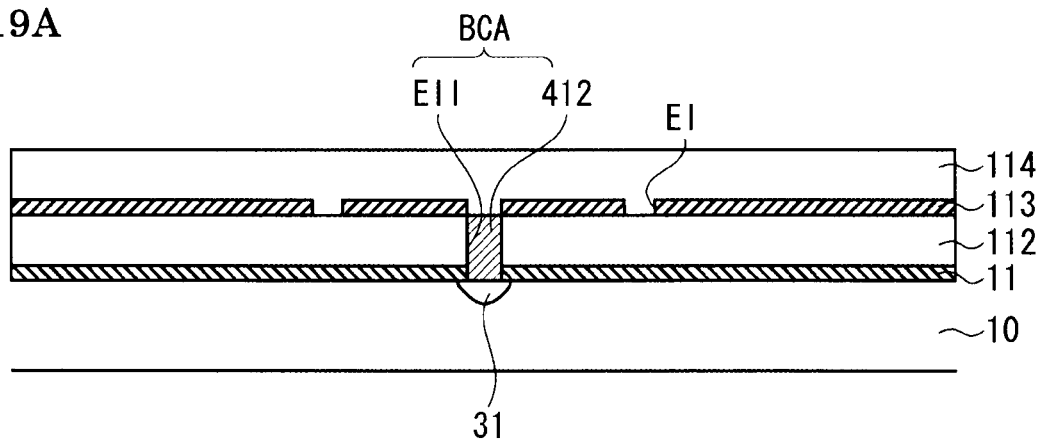
FIG. 19 is a cross-sectional view showing the fabricating process of the NAND flash memory successively from FIG. 18 according to the fourth embodiment.
Figure 19B:
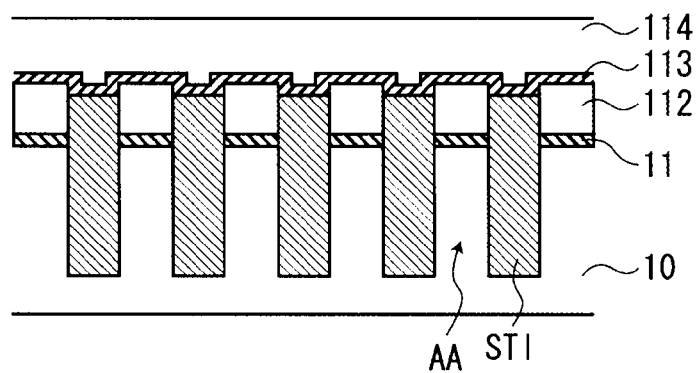
Figure 19C:
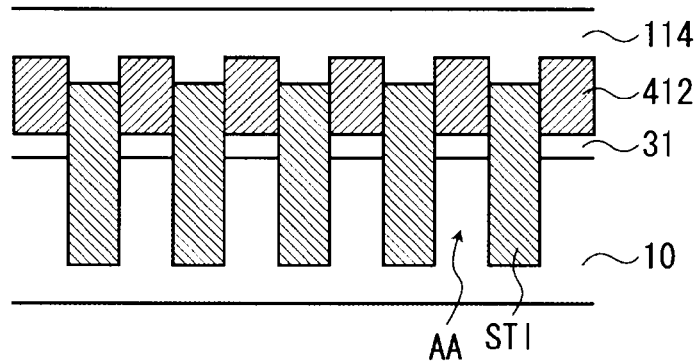

As shown in FIG. 19A-19C, the second poly-crystalline silicon film 114 are deposited in the opening EI, on the first poly-crystalline silicon film 112 exposed from the opening EI and the conductive material 412.

As a result, the first poly-crystalline silicon film 112 and the second poly-crystalline silicon film 114 are connected via the opening EI, and the connection diffusion layer 31 in the semiconductor substrate 10, the first poly-crystalline silicon film 112 and the second poly-crystalline silicon film 114 are connected via the opening EII.

Figure 20A:
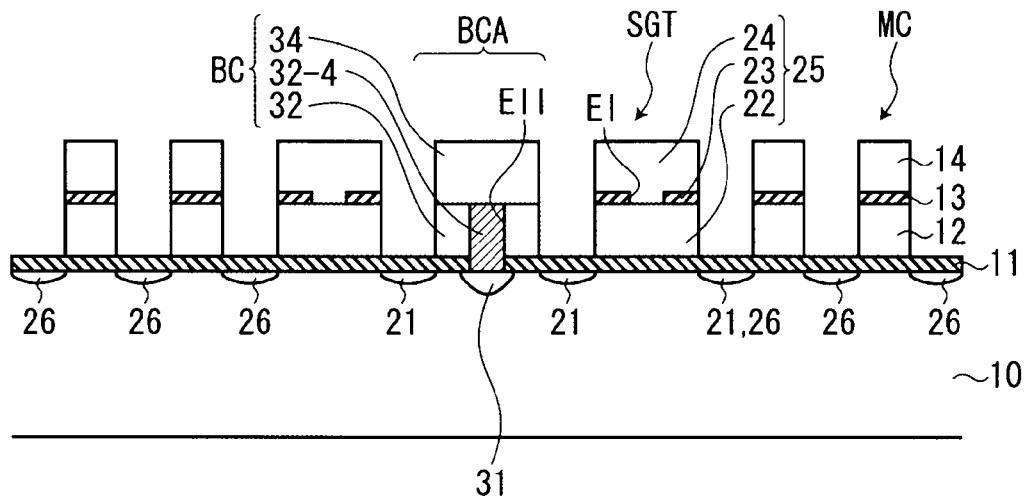
FIG. 20 is a cross-sectional view showing the fabricating process of the NAND flash memory successively from FIG. 19 according to the fourth embodiment.
Figure 20B:
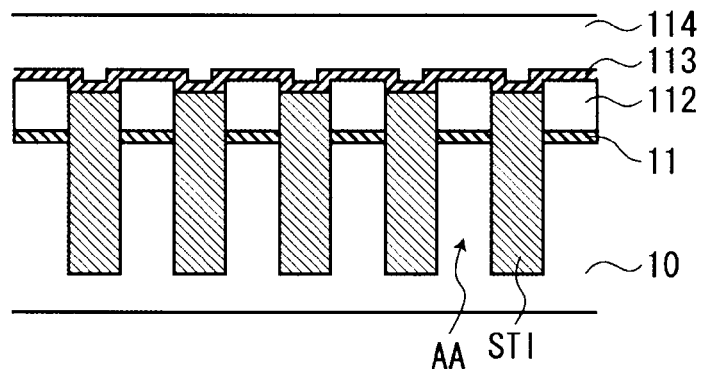
Figure 20C:
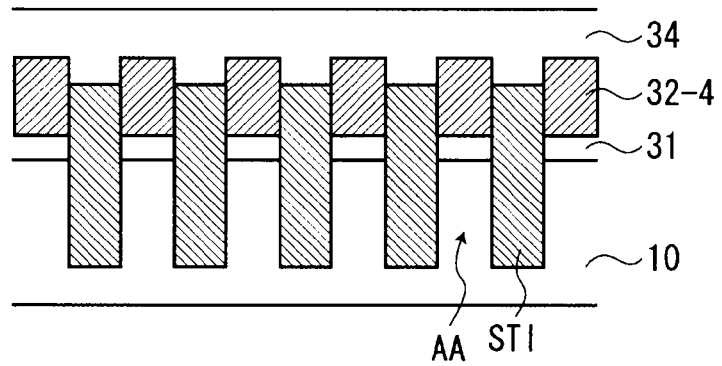

As shown in FIG. 20A-20C, a mask material composed of a silicon nitride film (not illustrated), for example, is formed on the second poly-crystalline 114. Further, a mask pattern extended to the word line direction is formed in the bit line contact area BCA as well as forming patterns of the word lines WL and the selection gate.

The first poly-crystalline silicon film 112, the insulator 113, the second poly-crystalline silicon film 114 and the mask material are removed by etching using the mask pattern. The gate electrode 25 of the memory cell MC and the selection gate transistor SGT, and the contact electrode BC are formed.

Here, the first poly-crystalline silicon film 112 in the memory cell MC is the floating gate electrode 12, the insulator 113 is the inter-gate insulator 13, and the second poly-crystalline silicon film 114 is the control gate electrode 14, respectively. Further, the first poly-crystalline silicon film 112 in the selection gate transistor SGT is the lower layer gate electrode 22, the insulator 113 is the inter-gate insulator 23, and the second poly-crystalline silicon film 114 is the upper gate electrode 24. Further, the first poly-crystalline silicon film 112 in the contact electrode BC is the bottom electrode 32, the conductive material 412 is the connection electrode 33-4, and the second poly-crystalline silicon film 114 is the top electrode 34.

Arsenic or phosphorous, for example, as an impurity is implanted into the semiconductor substrate 10 by ion-implantation using the gate electrodes 25 of both the memory cell MC and the selection gate transistor SGT, and the top electrode 34 of the contact electrode BC as a mask. As a result, the source-drain diffusion layers 21, 26 are formed to sandwich a portion between the adjacent memory cells MC and the gate electrode 25.

Figure 21A:
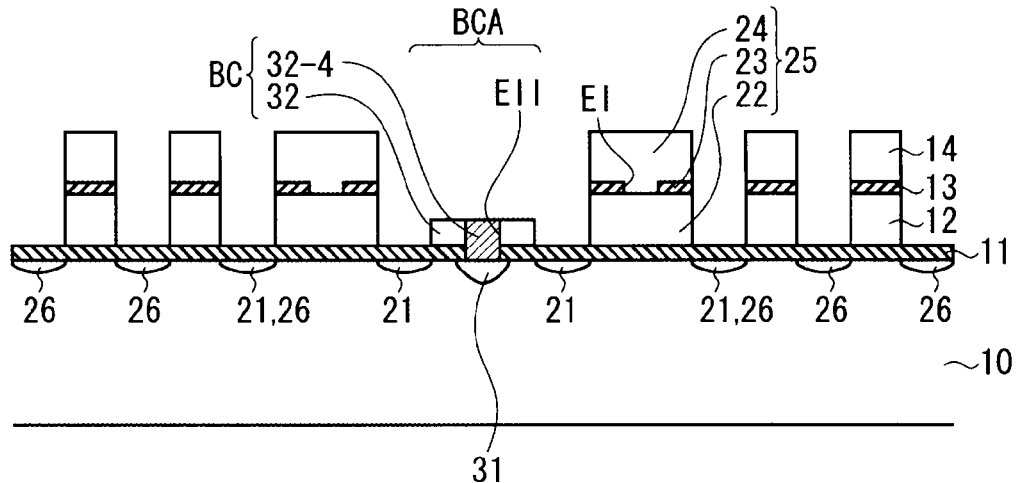
FIG. 21 is a cross-sectional view showing the fabricating process of the NAND flash memory successively from FIG. 20 according to the fourth embodiment.
Figure 21B:
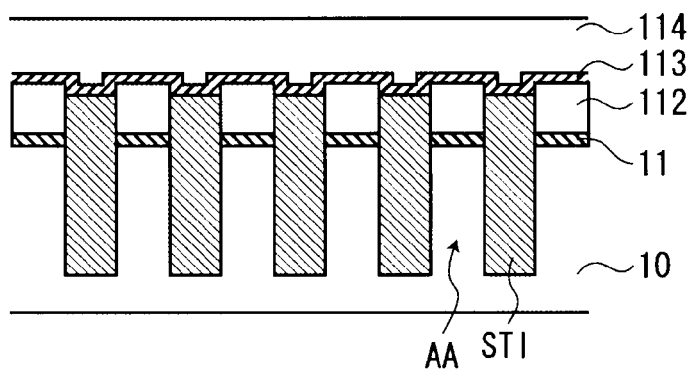
Figure 21C:
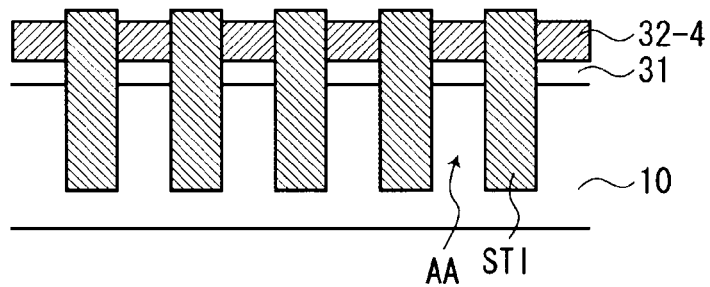

As shown in FIG. 21A-21C, a mask pattern (not illustrated) is formed to open the bit line contact area BCA, and the top electrode 34, the upper portions of the bottom electrode and the connection electrode are etched. The upper surfaces of the bottom electrode and the connection electrode are set to be lower than the upper surface of the isolation insulator in the etching process, so that each of the connection electrodes is separated to be form only on each of the active areas AA as shown in FIG. 16C. The process mentioned above is called as separating the connection electrode.

The mask pattern can entirely open the all over the bit line contact area BCA so as to enlarge lithography margin as the same as the third embodiment.

Further, the insulator 113 in the bit line contact area BCA is removed in forming the opening EI to enable to easily process the opening EI.

Further, the source-drain diffusion layers 21, 26 can be formed after separating the connection electrode. As a result, the source-drain diffusion layer 21 can be entirely formed under the bottom electrode. This structure can be obtained as following reason. The height of the bottom electrode is lower than the height of the gate electrodes of the memory cell MC and the selection gate transistor, therefore, the impurity ions by ion-implantation pass through the bottom electrode and reach at the semiconductor substrate 10. As a result, the connection diffusion layer 31 and the source-drain layer 21 can be connected each other, so that electrical potential of the contact electrode BC can be effectively transferred to the source-drain layer 21.

The inter-layer insulator 51, for example, a silicon oxide layer, is entirely deposited on the semiconductor substrate 10. An opening to expose the top electrode is formed in a region which the contact plug 35 is to be formed. A conductive material is embedded in the opening to form the contact plug 35.

The upper layer wiring 61 connected to the contact electrode BC is formed using well-known techniques, so that the nonvolatile semiconductor memory device as shown in FIG. 12 is completed.

Effects of Embodiment

According to the semiconductor memory device and the method of fabricating the semiconductor memory device in the fourth embodiment, at least five effects mentioned from the first embodiment to the third embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor substrate;
a gate insulator disposed on the semiconductor substrate;
a plurality of memory cells, each of the memory cells being arranged along a first direction and including a floating gate electrode above the semiconductor substrate via the gate insulator, a control gate electrode above the floating gate electrode via a first inter-gate insulator, first diffusion layers formed in the semiconductor substrate to sandwich a portion immediately beneath the floating gate electrode, each of the first diffusion layers having a reverse impurity type to the semiconductor substrate;
a contact electrode portion including a bottom electrode with a first opening and a top electrode on the bottom electrode, the bottom electrode being arranged on the gate insulator having the first opening, the top electrode being electrically connected to the semiconductor substrate via the first opening, and a second inter-gate insulator disposed between the bottom electrode and the top electrode;
a connection diffusion layer formed in the semiconductor substrate below the first opening and the connection diffusion layer having the reverse impurity type to the semiconductor substrate; and
a connection electrode in the first opening, and the top electrode being electrically connected to the semiconductor substrate via the connection electrode;
wherein a height of an upper surface of the connection electrode is lower than a height of an upper surface of the second inter-gate insulator.

2. The device of claim 1, wherein
the floating electrode is formed of the same material as the bottom electrode, the first inter-gate insulator is formed of the same material as the second inter-gate insulator, and the control gate electrode is formed of the same material as the top electrode.

3. A semiconductor memory device, comprising:
a semiconductor substrate;
a gate insulator disposed on the semiconductor substrate;
a plurality of memory cells, each of the memory cells being arranged along a first direction and including a floating gate electrode above the semiconductor substrate via the gate insulator, a control gate electrode above the floating gate electrode via a first inter-gate insulator, first diffusion layers formed in the semiconductor substrate to sandwich a portion immediately beneath the floating gate electrode, each of the first fusion layers having a reverse impurity type to the semiconductor substrate;
a contact electrode portion including a bottom electrode with a first opening and a top electrode on the bottom electrode, the bottom electrode being arranged on the gate insulator having the first opening, the top electrode being electrically connected to the semiconductor substrate via the first opening;

a connection diffusion layer formed in the semiconductor substrate below the first opening and the connection diffusion layer having the reverse impurity type to the semiconductor substrate; and
a selection gate portion between an end of the plurality of the memory cells and the contact electrode portion, and a selection gate transistor arranged in the selection gate portion.

4. The device of claim 3, wherein
the selection gate transistor including a gate electrode above the semiconductor substrate via the gate insulator and second diffusion layers formed in the semiconductor substrate to sandwich a portion immediately beneath the gate electrode.

5. The device of claim 4, wherein
the gate electrode is constituted with a lower electrode and an upper electrode on the lower electrode via the first inter-gate insulator having a second opening, and the lower electrode and the upper electrode are electrically connected each other via the second opening.

6. The device of claim 4, wherein
the second diffusion layer is electrically connected to the first diffusion layer.

7. A semiconductor memory device, comprising:
a semiconductor substrate;
a gate insulator on the semiconductor substrate;
a plurality of memory cells, each of the memory cells being arranged along a first direction and including a floating gate electrode above the semiconductor substrate via the gate insulator, a control gate electrode above the floating gate electrode via a first inter-gate insulator, first diffusion layers formed in the semiconductor substrate to sandwich a portion immediately beneath the floating gate electrode, each of the first diffusion layers having a reverse impurity type to the semiconductor substrate;
a contact electrode portion on the gate insulator having a first opening including a bottom electrode being electrically connected to the semiconductor substrate via the first opening; and
diffusion layers formed in the semiconductor substrate below the first opening, each of the diffusion layers having the reverse impurity type to the semiconductor substrate.

8. The device of claim 7, further comprising:
a connection electrode formed in the opening penetrating the gate insulator and the bottom electrode, the bottom electrode being electrically connected to the semiconductor substrate via the connection electrode in the first opening.

9. The device of claim 8, wherein
a resistivity of the connection electrode is lower than resistivity of the bottom electrode.

10. The device of claim 1, wherein
a resistivity of the connection electrode is lower than that of the bottom electrode.

11. The device of claim 9, wherein
a resistivity of the connection electrode is lower than that of a top electrode.

* * * * *